United States Patent
Park

(10) Patent No.: US 11,164,632 B2
(45) Date of Patent: *Nov. 2, 2021

(54) NONVOLATILE MEMORY DEVICE AND METHOD OF PROCESSING IN MEMORY (PIM) USING THE SAME

(71) Applicant: SAMSUNG ELECTRONICS CO., LTD., Suwon-si (KR)

(72) Inventor: Se-Hwan Park, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/187,781

(22) Filed: Feb. 27, 2021

(65) Prior Publication Data

US 2021/0183446 A1 Jun. 17, 2021

Related U.S. Application Data

(63) Continuation of application No. 16/550,195, filed on Aug. 24, 2019, now Pat. No. 10,971,230.

(30) Foreign Application Priority Data

Dec. 31, 2018 (KR) .................. 10-2018-0173558

(51) Int. Cl.
*G11C 16/04* (2006.01)
*G11C 16/26* (2006.01)
(Continued)

(52) U.S. Cl.
CPC ........... *G11C 16/0483* (2013.01); *G06N 3/04* (2013.01); *G11C 16/26* (2013.01); *G11C 29/04* (2013.01);
(Continued)

(58) Field of Classification Search
CPC ............................ G11C 16/0483; G11C 16/26
(Continued)

(56) References Cited

U.S. PATENT DOCUMENTS 7,551,491 B2 6/2009 Kim et al.
8,614,917 B2 12/2013 Shim et al.
(Continued)

FOREIGN PATENT DOCUMENTS

KR 1320519 10/2013

*Primary Examiner* — Anthan Tran
(74) *Attorney, Agent, or Firm* — Volentine, Whitt & Francos, PLLC

(57) ABSTRACT

A nonvolatile memory device includes a memory cell array, an input current generator, an operation cell array and an analog-to-digital converter. The memory cell array includes NAND strings storing multiplicand data, wherein first ends of the NAND strings are connected to bitlines and second ends of the NAND strings output multiplication bits corresponding to bitwise multiplication of the multiplicand data stored in the NAND strings and multiplier data loaded on the bitlines. The input current generator generates input currents. The operation cell array includes switching transistors. Gate electrodes of the switching transistors are connected to the second ends of the NAND strings. The switching transistors selectively sum the input currents based on the multiplication bits to output the output currents. The analog-to-digital converter converts the output currents to digital values.

20 Claims, 29 Drawing Sheets

(51) Int. Cl.
  *G11C 29/04* (2006.01)
  *H01L 27/115* (2017.01)
  *G11C 16/24* (2006.01)
  *G06N 3/04* (2006.01)

(52) U.S. Cl.
  CPC ...... *G11C 16/24* (2013.01); *G11C 2029/0401* (2013.01); *H01L 27/115* (2013.01)

(58) Field of Classification Search
  USPC .................................................. 365/185.17
  See application file for complete search history.

(56) References Cited

U.S. PATENT DOCUMENTS

| | | |
|---|---|---|
| 8,773,903 B2 | 7/2014 | Lee et al. |
| 8,984,249 B2 | 3/2015 | Pyeon et al. |
| 8,990,483 B2 | 3/2015 | Kwak |
| 9,378,824 B2 | 6/2016 | Byun |
| 9,711,520 B2 | 7/2017 | Nowak et al. |
| 9,760,533 B2 | 9/2017 | Fick et al. |
| 10,971,230 B2 * | 4/2021 | Park .......................... G06N 3/04 |
| 2013/0215683 A1 | 8/2013 | Lee et al. |
| 2015/0054666 A1 | 12/2015 | Kim et al. |

* cited by examiner

FIG. 15

$$MY = MW \ast MX = \begin{bmatrix} W11 & W12 & \cdots & W1r \\ W21 & W22 & \cdots & W2r \\ \vdots & & \ddots & \vdots \\ Wp1 & Wp2 & \cdots & Wpr \end{bmatrix} \begin{bmatrix} X11 & X12 & \cdots & X1q \\ X21 & X22 & \cdots & X2q \\ \vdots & & \ddots & \vdots \\ Xr1 & Xr2 & \cdots & Xrq \end{bmatrix} = \begin{bmatrix} Y11 & Y12 & \cdots & Y1q \\ Y21 & Y22 & \cdots & Y2q \\ \vdots & & \ddots & \vdots \\ Yr1 & Yr2 & \cdots & Yrq \end{bmatrix}$$

$$= \begin{bmatrix} W11X11+W12X21+ & \cdots & +W1rXr1 & \cdots & W11X1q+W12X2q+ & \cdots & W1rXrq \\ W21X32+W22X21+ & \cdots & +W2rXr1 & \cdots & W21X1q+W22X2q+ & \cdots & W2rXrq \\ & \vdots & & \ddots & & \vdots & \\ Wp1X11+Wp2X21+ & \cdots & +WprXr1 & \cdots & Wp1X1q+Wp2X2q+ & \cdots & WprXrq \end{bmatrix}$$

NONVOLATILE MEMORY DEVICE AND METHOD OF PROCESSING IN MEMORY (PIM) USING THE SAME

CROSS-REFERENCE TO RELATED APPLICATION

This is a Continuation of U.S. application Ser. No. 16/550,195, filed Aug. 24, 2019, which issued as U.S. Pat. No. 10,971,230 on Apr. 6, 2021, and in which a claim of priority under 35 USC § 119 is made to Korean Patent Application No. 10-2018-0173558, filed on Dec. 31, 2018, in the Korean Intellectual Property Office (KIPO), the entire content of which is hereby incorporated by reference.

BACKGROUND

The present disclosure relates generally to semiconductor integrated circuits, and more particularly to a nonvolatile memory device and a method of processing in memory (PIM) using a nonvolatile memory device.

Memory bandwidth and latency are performance bottlenecks in many processing systems. Memory capacity may be increased through the use of stacked memory devices in which a plurality of semiconductor devices are stacked in a package of a memory chip. The stacked semiconductor dies may be electrically connected through the use of through-silicon vias or through-substrate vias (TSVs). In addition, a vertical NAND flash memory device includes memory cells that are disposed or stacked in a vertical direction to increase the memory capacity. Such stacking technology may increase memory capacity and also suppress bandwidth and latency penalties. However, inter-device bandwidth and inter-device latency may have significant impact on processing efficiency and power consumption of such processing systems when a task of an external device requires multiple accesses to the stacked memory device.

SUMMARY

Embodiments of the inventive concepts provide a memory device and/or a processing in memory (PIM) method using a memory device and/or a computing in memory (CIM) method using the memory device.

Embodiments of the inventive concepts provide a nonvolatile memory device including a memory cell array, an input current generator, an operation cell array and an analog-to-digital converter. The memory cell array includes a plurality of NAND strings storing multiplicand data, wherein first ends of the plurality of NAND strings are connected to a plurality of bitlines and second ends of the plurality of NAND strings output a plurality of multiplication bits corresponding to bitwise multiplication of the multiplicand data stored in the plurality of NAND strings and multiplier data loaded on the plurality of bitlines. The input current generator generates a plurality of input currents. The operation cell array includes a plurality of switching transistors, gate electrodes of the plurality of switching transistors are connected to the second ends of the plurality of NAND strings, such that the plurality of switching transistors selectively sum the plurality of input currents based on the plurality of multiplication bits to output a plurality of output currents. The analog-to-digital converter converts the plurality of output currents to a plurality of digital values.

Embodiments of the inventive concepts further provide a nonvolatile memory device including a plurality of bitlines extending in a column direction and arranged in a row direction, a plurality of input lines extending in the column direction and arranged in the row direction, a plurality of output lines extending in the row direction and arranged in the column direction, a plurality of NAND strings arranged in a plurality of rows and a plurality columns, first ends of the plurality of NAND strings connected to the plurality of bitlines, and a plurality of switching transistors arranged in a plurality of rows and a plurality of columns, gate electrodes of the plurality of switching transistors are connected to the second ends of the plurality of NAND strings, each of the plurality of switching transistors are connected between an input line of the plurality of input lines and an output line of the plurality of output lines.

Embodiments of the inventive concepts still further provide a processing in memory (PIM) method using a nonvolatile memory device. The PIM includes storing multiplicand data in a plurality of NAND strings of a nonvolatile memory device, wherein first ends of the plurality of NAND strings are connected to a plurality of bitlines, and second ends of the plurality of NAND strings are connected to gate electrodes of a plurality of switching transistors; loading multiplier data on the plurality of bitlines; performing a read sensing operation of the multiplicand data to apply a plurality of multiplication bits to the gate electrodes of the plurality of switching transistors based on the sensed multiplicand data, the plurality of multiplication bits corresponding to bitwise multiplication of the multiplicand data stored in the plurality of NAND strings and the multiplier data loaded on the plurality of bitlines; and selectively summing a plurality of input currents using the plurality of switching transistors that are switched based on the plurality of multiplication bits to output a plurality of output currents.

Embodiments of the inventive concepts also provide a memory system including a memory controller; and a nonvolatile memory device including NAND strings connected to bitlines and to switching transistors, the nonvolatile memory device configured to access memory cells of the NAND strings responsive to the memory controller. The nonvolatile memory device further configured to store multiplicand data in the NAND strings, load multiplier data on the bitlines, perform a read sensing operation of the multiplicand data to generate multiplication bits, apply the multiplication bits to gate electrodes of the switching transistors, and selectively sum input currents using the switching transistors that are switched based on the multiplication bits to provide output currents. The multiplication bits correspond to bitwise multiplication of the multiplicand data and the multiplier data.

The nonvolatile memory device and the processing in memory (PIM) method using the nonvolatile memory device according to example embodiments may reduce processing time and power consumption by performing data-intensive processing using the operation cell array included in the nonvolatile memory device to reduce an amount of data transferred between the memory device and external devices.

The nonvolatile memory device and the processing in memory (PIM) method using the nonvolatile memory device according to example embodiments may reduce processing time and power consumption by performing data-intensive processing such as MLP (multilayer perceptron), RNN (recurrent neural network), CNN (convolutional neural network), and the like by performing the parallel bitwise multiplications through the sensing multiplication operation of the NAND strings and performing the analog addition operation using an operation cell array.

BRIEF DESCRIPTION OF THE DRAWINGS

Embodiments of the inventive concepts will be more clearly understood from the following detailed description taken in conjunction with the accompanying drawings.

FIG. 15 illustrates a diagram of an example of a matrix multiplication.

DETAILED DESCRIPTION OF THE EMBODIMENTS

Figure 1:
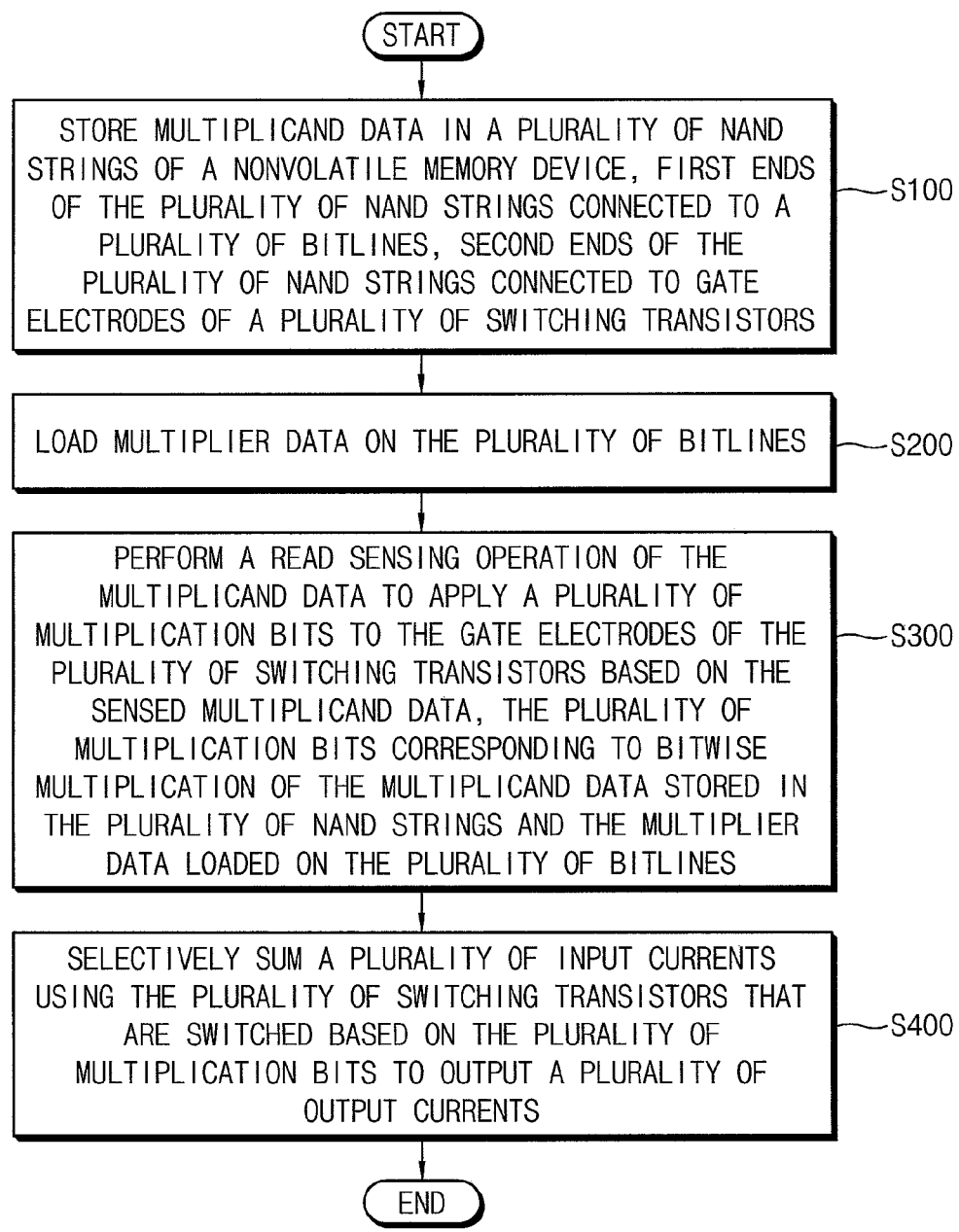
FIG. 1 illustrates a flow chart of a processing in memory (PIM) method according to embodiments of the inventive concepts.

Various example embodiments of the inventive concepts will be described more fully hereinafter with reference to the accompanying drawings. In the drawings, like numerals refer to like elements throughout, and repeated description of like elements may be omitted.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a flow chart of a processing in memory method according to embodiments of the inventive concepts.

Referring to FIG. 1, multiplicand data are stored in a plurality of NAND strings of a nonvolatile memory device. First ends of the plurality of NAND strings are connected to a plurality of bitlines, and second ends of the plurality of NAND strings are connected to gate electrodes of a plurality of switching transistors (S100). After that, multiplier data are loaded on the plurality of bitlines (S200). The multiplicand data and the multiplier data described with respect to FIG. 1 do not indicate particular values or data or data type but indicate two arbitrary values or data that are to be multiplied. In some example embodiments, the multiplicand data may correspond to weight values of an artificial neural network (ANN) and the multiplier data may correspond to input values or activation values of the ANN. In some example embodiments, the multiplicand values may correspond to the input values and the multiplier values may correspond to the weight values.

A read sensing operation of the multiplicand data is performed to apply a plurality of multiplication bits to the gate electrodes of the plurality of switching transistors based on sensed multiplicand data. The plurality of multiplication bits correspond to bitwise multiplication of the multiplicand data stored in the plurality of NAND strings and the multiplier data loaded on the plurality of bitlines (S300). Example embodiments of applying the plurality of multiplication bits to the gate electrodes of the switching transistors will be described hereinafter with reference to FIG. 9.

A plurality of input currents are selectively summed using the plurality of switching transistors that are switched based on the plurality of multiplication bits to output a plurality of output currents (S400). Example embodiments of generating the plurality of output currents using the plurality of switching transistors will be described hereinafter with reference to FIGS. 10 through 12.

Example embodiments of connecting the plurality of bitlines, the plurality of NAND strings and the plurality of switching transistors will be described hereinafter with reference to FIGS. 3 and 4.

Figure 2:
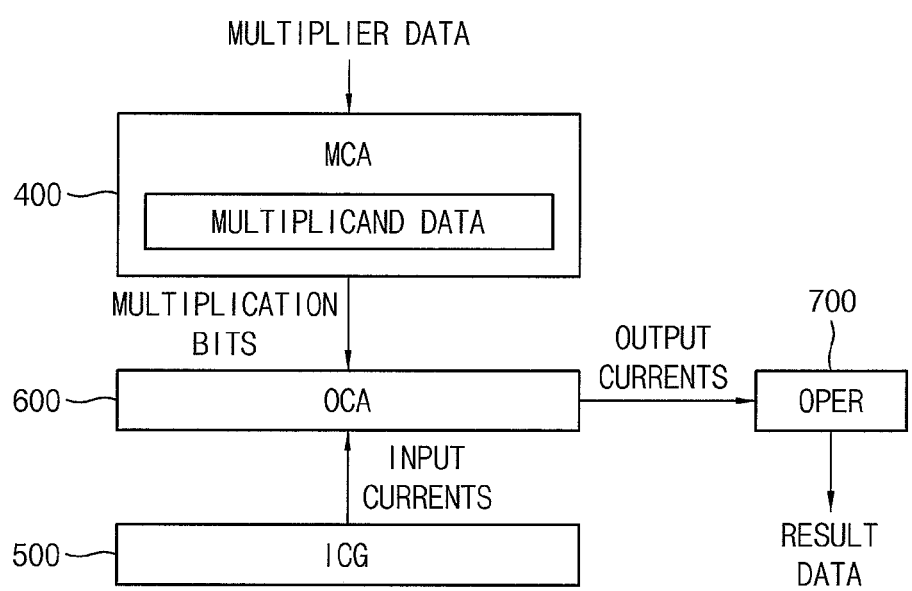
FIG. 2 illustrates a block diagram of a nonvolatile memory device according to embodiments of the inventive concepts.

FIG. 2 illustrates a block diagram of a nonvolatile memory device according to embodiments of the inventive concepts.

Referring to FIG. 2, a nonvolatile memory device 1000 includes a memory cell array (MCA) 400, in input current generator (ICG) 500, an operation cell array (OCA) 600 and an operation circuit (OPER) 700.

The memory cell array 400 includes a plurality of NAND strings storing multiplicand data. First ends of the plurality of NAND strings are connected to a plurality of bitlines. Example embodiments of the memory cell array 400 will be described below with reference to FIGS. 7 and 8. The memory cell array 400 outputs through second ends of the plurality of NAND strings a plurality of multiplication bits corresponding to bitwise multiplication of the multiplicand data stored in the plurality of NAND strings and multiplier data loaded on the plurality of bitlines. The memory cell array 400 may perform bitwise multiplications automatically by a read sensing operation with respect to the stored data, which may be referred to as a sensing multiplication operation.

The input current generator 500 may generate a plurality of input currents and provide the plurality of input currents to the operation cell array 600. The input current generator 500 may generate the plurality of input currents to have equal magnitude with respect to each other as will be described hereinafter with reference to FIG. 10, or the input current generator may generate the plurality of input currents to have different magnitudes corresponding to different weight values as will be described hereinafter with reference to FIGS. 11 and 12. Information on the magnitudes of the input currents may be stored in the nonvolatile memory device 1000 and may be varied based on a control value provided from an external device.

The operation cell array 600 may include a plurality of switching transistors. Gate electrodes of the plurality of switching transistors are connected to the second ends of the plurality of NAND strings. The plurality of switching transistors may be turned on based on the plurality of multiplication bits. Through the selective switching of the switching transistors, the operation cell array 600 may selectively sum the plurality of input currents to output a plurality of output currents. The selective summing of the switching transistors may be referred to as an analog addition operation.

The operation circuit 700 may include an analog-to-digital converter configured to convert the plurality of output currents to a plurality of digital values. The operation circuit 700 may provide result data based on the plurality of digital values. The operation circuit 700 may further include an error detector for error checking and correction, as will be described hereinafter with reference to FIG. 13. The operation circuit 700 may further include weighted adders and an accumulator for a matrix multiplication, as will be described below with reference to FIGS. 18 and 19.

Hereinafter, a direction substantially vertical to the top surface of a substrate is referred to as a first direction or a vertical direction D1, and two directions substantially parallel to the top surface of the substrate and crossing each other are referred to as a second direction (or a row direction) D2 and a third direction (or a column direction) D3. For example, the second and third directions D2 and D3 may be perpendicular to each other. It should be understood that a direction indicated by an arrow in the figures and a reverse direction thereof are considered as the same direction. The definition of the first, second and third directions D1, D2 and D3 indicate the same respective directions in the various figures. The numbers of elements in the figures are for convenience of illustration and description, and example embodiments are not limited to any particular numbers of elements.

Figure 3:
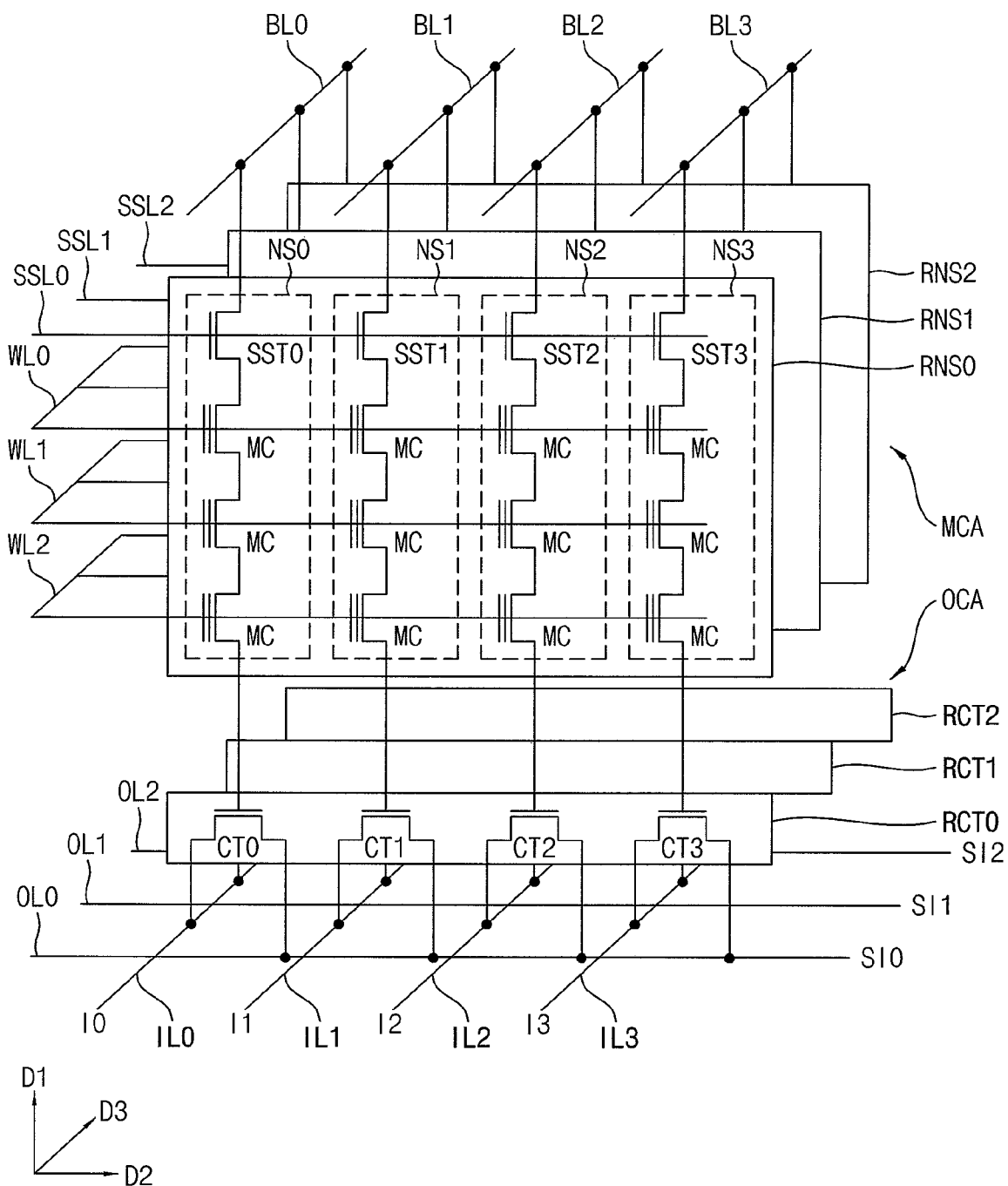
FIG. 3 illustrates a diagram of a memory cell array and an operation cell array included in a nonvolatile memory device according to embodiments of the inventive concepts.

FIG. 3 illustrates a diagram of a memory cell array and an operation cell array included in a nonvolatile memory device according to embodiments of the inventive concepts.

FIG. 3 illustrates a configuration of a first string row RNS0 for convenience to simplify the drawing, and configuration of the other string rows RNS1 and RNS2 are substantially the same as the configuration of the first string row RNS0. Similarly, the operation cell rows RCT1 and RCT2 may have configuration substantially the same as the illustrated configuration of first operation cell row RCT0.

Referring to FIG. 3, a memory cell array MCA may include a plurality of bitlines BL0~BL3 extending in a column direction D3 and arranged in a row direction D2, and a plurality of NAND strings NS0~NS3 arranged in a plurality of rows and a plurality columns. First ends of the plurality of NAND strings NS0~NS3 are connected to the plurality of bitlines BL0~BL3. For example, NAND strings NS0 and NS1 are respectively connected to bitlines B0 and B1. Each NAND string NSj (j=0, 1, 2, 3) may include a string selection transistor SSTj at a first end portion and a plurality of memory cells MC. The gate electrodes of each of the string selection transistors SSTj are connected to string selection lines SSLi (i=0, 1, 2), and each of the memory cells MC is connected to a corresponding wordline WLk (k=0, 1, 2). For example, the gate electrodes of the string selection transistors of the first string row RNS0 are connected to string selection line SSL0, and the gate electrodes of the string selection transistors of the second string row RNS1 are connected to string selection line SSL1. According to example embodiments, although not shown in FIG. 3, each NAND string NSj may further include a ground selection transistor at a second end portion.

An operation cell array OCA may include a plurality of input lines IL0~IL3 extending in the column direction D3 and arranged in the row direction D2, a plurality of output lines OL0~OL2 extending in the row direction D2 and arranged in the column direction D3, and a plurality of switching transistors CT0~CT3

The plurality of input lines IL0~IL3 may receive a plurality of input currents I0~I3, respectively, and the plurality of output lines OL0~OL2 may output a plurality of output currents SI0~SI2, respectively.

The plurality of switching transistors CT0~CT3 may be arranged in a plurality of rows and a plurality of columns, and gate electrodes of the plurality of switching transistors CT0~CT3 are respectively connected to second ends of the plurality of NAND strings NS0~NS3. When each switching transistor CTj is turned on, the corresponding input line ILj is electrically connected to the corresponding output line OLi and the input current Ij applied to the corresponding input line ILj is added to the output current SIi output through the corresponding output line OLi.

Figure 4:
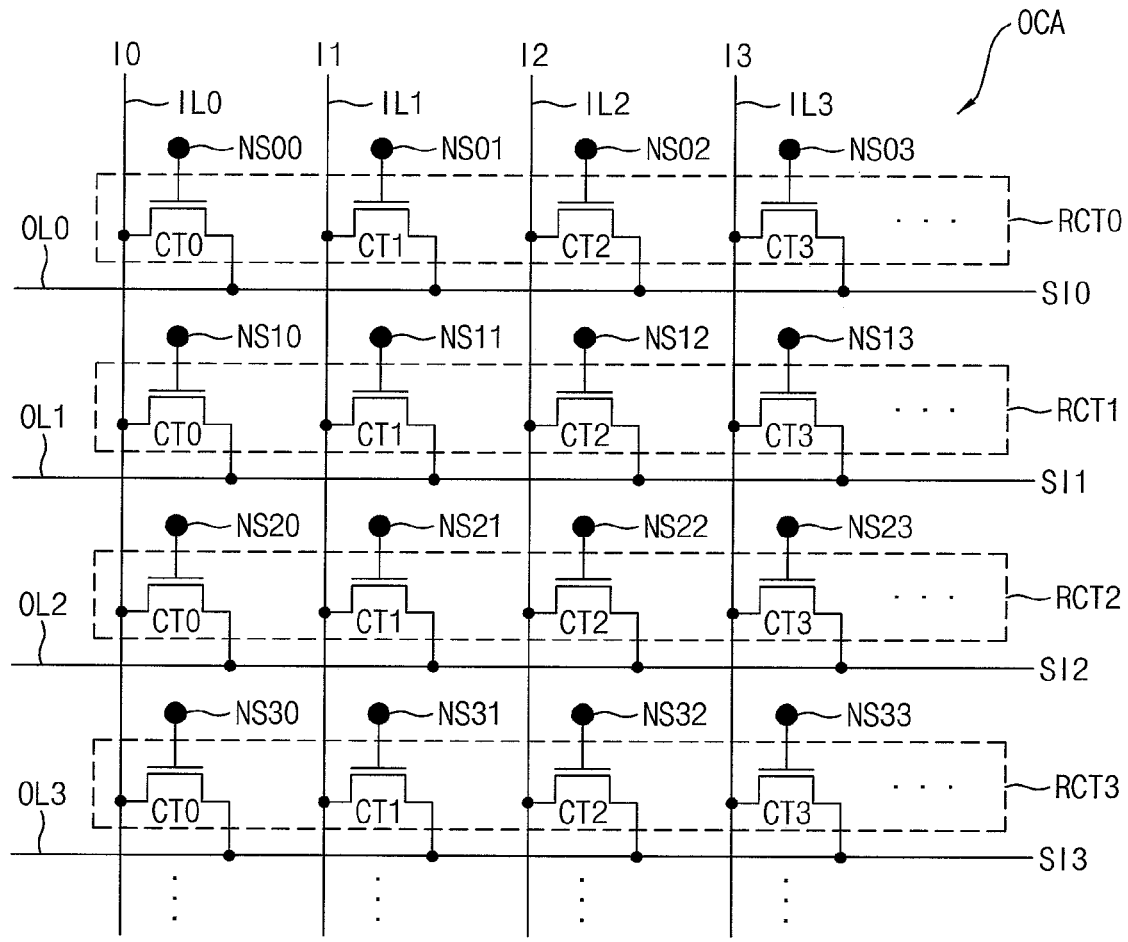
FIG. 4 illustrates a diagram of a layout of an operation cell array included in a nonvolatile memory device according to embodiments of the inventive concepts.

FIG. 4 illustrates a diagram of a layout of an operation cell array included in a nonvolatile memory device according to embodiments of the inventive concepts.

Referring to FIG. 4, an operation cell array OCA may include a plurality of input lines IL0~IL3 extending in the column direction D3 and arranged in the row direction D2, a plurality of output lines OL0~OL3 extending in the row direction D2 and arranged in the column direction D3, and a plurality of switching transistors CT0~CT3.

The plurality of switching transistors CT0~CT3 may be arranged in a plurality of rows and a plurality of columns, and gate electrodes of the plurality of switching transistors CT0~CT3 are connected to second ends of the plurality of NAND strings NS00~NS33. First electrodes of the switching transistors arranged in the same column are connected to the same input line, and second electrodes of the switching transistors arranged in the same row are connected to the same output line. For example, the first electrodes of the switching transistors CT1 of the second column are connected to the second input line ILL and the switching transistors of the third row (i.e., the switching transistors CT0~CT3 included in the third operation cell row RCT2) are connected to the third output line OL2. Here, the first and second electrodes indicate drain and source electrodes of a transistor.

The switching transistors CT0~CT3 included in each of the first through fourth operation cell rows RCT0~RCT3 may contribute to each of the first through fourth output currents SI0~SI3 of the first through fourth output lines OL0~OL3, respectively. For example, when only the second and third switching transistors CT1 and CT2 in the first operation cell row RCT0 are turned on, the first output current SI0 output through the first output line OL0 corresponds to I1+I2.

Using such operation cell array OCA, the analog addition operation for summing currents may be performed efficiently.

Figure 5:
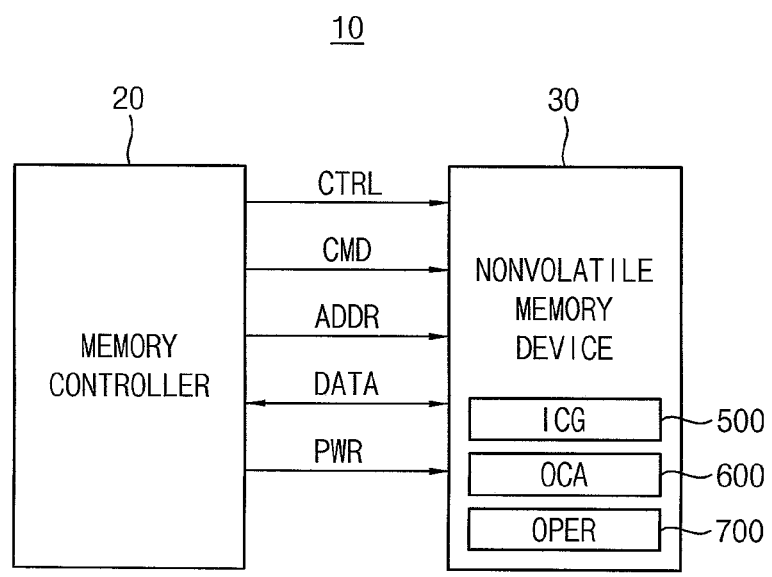
FIG. 5 illustrates a block diagram of a memory system according to embodiments of the inventive concepts.

FIG. 5 illustrates a block diagram of a memory system according to embodiments of the inventive concepts.

Referring to FIG. 5, a memory system 10 may include a memory controller 20 and at least one (nonvolatile) memory device 30.

The memory device 30 may be a nonvolatile memory device such as for example a three-dimensional or vertical NAND flash memory device, and the memory system 10 may include data storage media of nonvolatile memory such as a memory card, universal serial bus (USB) memory, solid state drive (SSD), and the like.

The nonvolatile memory device 30 may perform a read operation, an erase operation, a program operation, and/or a write operation under control of the memory controller 20. The nonvolatile memory device 30 receives from the memory controller 20 a command CMD, an address ADDR and data DATA through input/output lines for performing such operations. In addition, the nonvolatile memory device 30 receives from the memory controller 20 a control signal CTRL through a control line. Also, the nonvolatile memory device 30 receives power PWR from the memory controller 20 through a power line.

The nonvolatile memory device 30 may include an input current generator ICG 500, an operation cell array OCA 600 and an operation circuit OPER 700, which are configured to perform a sensing multiplication operation and an analog addition operation according to example embodiments.

Figure 6:
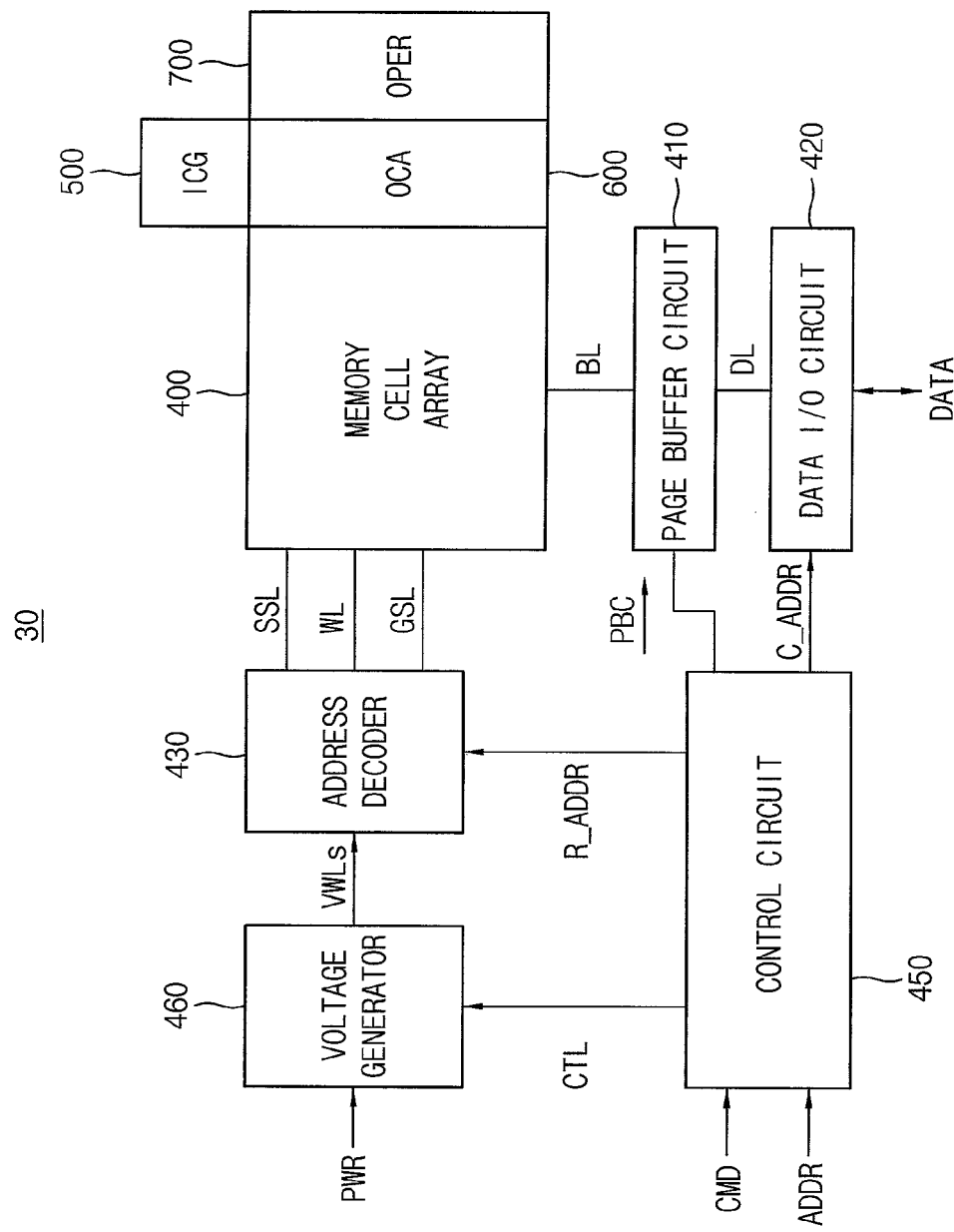
FIG. 6 illustrates a block diagram of a nonvolatile memory device according to embodiments of the inventive concepts.

FIG. 6 illustrates a block diagram of a nonvolatile memory device according to embodiments of the inventive concepts.

Referring to FIG. 6, the nonvolatile memory device 30 includes a memory cell array 400, a page buffer circuit 410, a data input/output (I/O) circuit 420, an address decoder 430, a control circuit 450, a voltage generator 460, an input current generator (ICG) 500, an operation cell array OCA 600 and an operation circuit OPER 700.

The memory cell array 400 may be coupled to the address decoder 430 through a plurality of string selection lines SSL, a plurality of word lines WL, and a plurality of ground selection lines GSL. In addition, the memory cell array 400 may be coupled to the page buffer circuit 410 through a plurality of bit lines BL.

The memory cell array 400 may include a plurality of memory cells coupled to the plurality of word lines WL and the plurality of bit lines BL. In some example embodiments, the memory cell array 400 may be a three-dimensional memory cell array, which is formed on a substrate in a three-dimensional structure (or a vertical structure). In this case, the memory cell array 400 may include a plurality of NAND strings that are vertically oriented such that at least one memory cell is located over another memory cell.

The control circuit 450 may receive a command (signal) CMD and an address (signal) ADDR from the memory controller 20. The control circuit 450 may control erasure, programming and read operations of the nonvolatile memory device 30 based on the command signal CMD and the address signal ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 450 may generate the control signals CTL which are used for controlling the voltage generator 460 and may generate the page buffer control signal PBC for controlling the page buffer circuit 410, based on the command signal CMD. The control circuit 450 may generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 400 through the plurality of string selection lines SSL, the plurality of word lines WL, and the plurality of ground selection lines GSL. During the program operation or the read operation, the address decoder 430 may determine one of the plurality of word lines WL as a selected word line, and may determine the rest of the plurality of word lines WL other than the selected word line as unselected word lines, based on the row address R_ADDR. In addition, during the program operation or the read operation, the address decoder 430 may determine one of the plurality of string selection lines SSL as a selected string selection line, and may determine the rest of the plurality of string selection lines SSL other than the selected string selection line as unselected string selection lines, based on the row address R_ADDR.

The voltage generator 460 may generate word line voltages VWLs, which may be needed for the operation of the memory cell array 400 of the nonvolatile memory device 30, based on the control signals CTL. The voltage generator 460 may receive power PWR from the memory controller 20. The word line voltages VWLs may be applied to the plurality of word lines WL through the address decoder 430.

The page buffer circuit 410 may be coupled to the memory cell array 400 through the plurality of bit lines BL. The page buffer circuit 410 may include a plurality of buffers. In some example embodiments, each buffer may be connected to one bit line. In other example embodiments, each buffer may be connected to two or more bit lines. The page buffer circuit 410 may temporarily store data to be programmed in a selected page, or data read out from the selected page of the memory cell array 400.

The data input/output circuit 420 may be coupled to the page buffer circuit 410 through data lines DL. During the program operation, the data input/output circuit 410 may receive program data DATA received from the memory controller 20 and may provide the program data DATA to the page buffer circuit 410 based on the column address C_ADDR received from the control circuit 450. During the read operation, the data input/output circuit 420 may provide read data DATA (read from the memory cell array 400 and stored in the page buffer circuit 410) to the memory controller 20 based on the column address C_ADDR received from the control circuit 450.

The memory cell array 400, the input current generator 500, the operation cell array 600 and the operation circuit 700 may perform a sensing multiplication operation and an analog addition operation for a processing in memory (PIM) method according to example embodiments.

Figure 7:
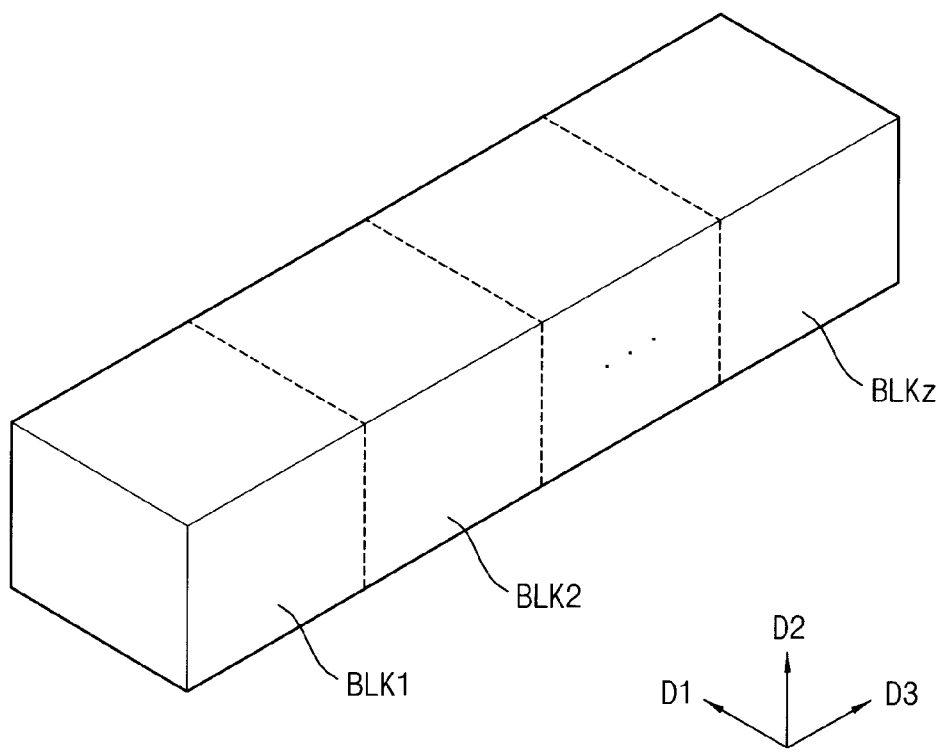
FIG. 7 illustrates a block diagram of a memory cell array included in the nonvolatile memory device of FIG. 6.

FIG. 7 illustrates a block diagram of a memory cell array included in the nonvolatile memory device of FIG. 6.

Referring to FIG. 7, a memory cell array 400 may include a plurality of memory blocks BLK1 to BLKz. In some example embodiments, the memory blocks BLK1 to BLKz are selected by the address decoder 430 in FIG. 6. For example, the address decoder 430 may select a particular memory block BLK corresponding to a block address among the memory blocks BLK1 to BLKz.

Figure 8A:
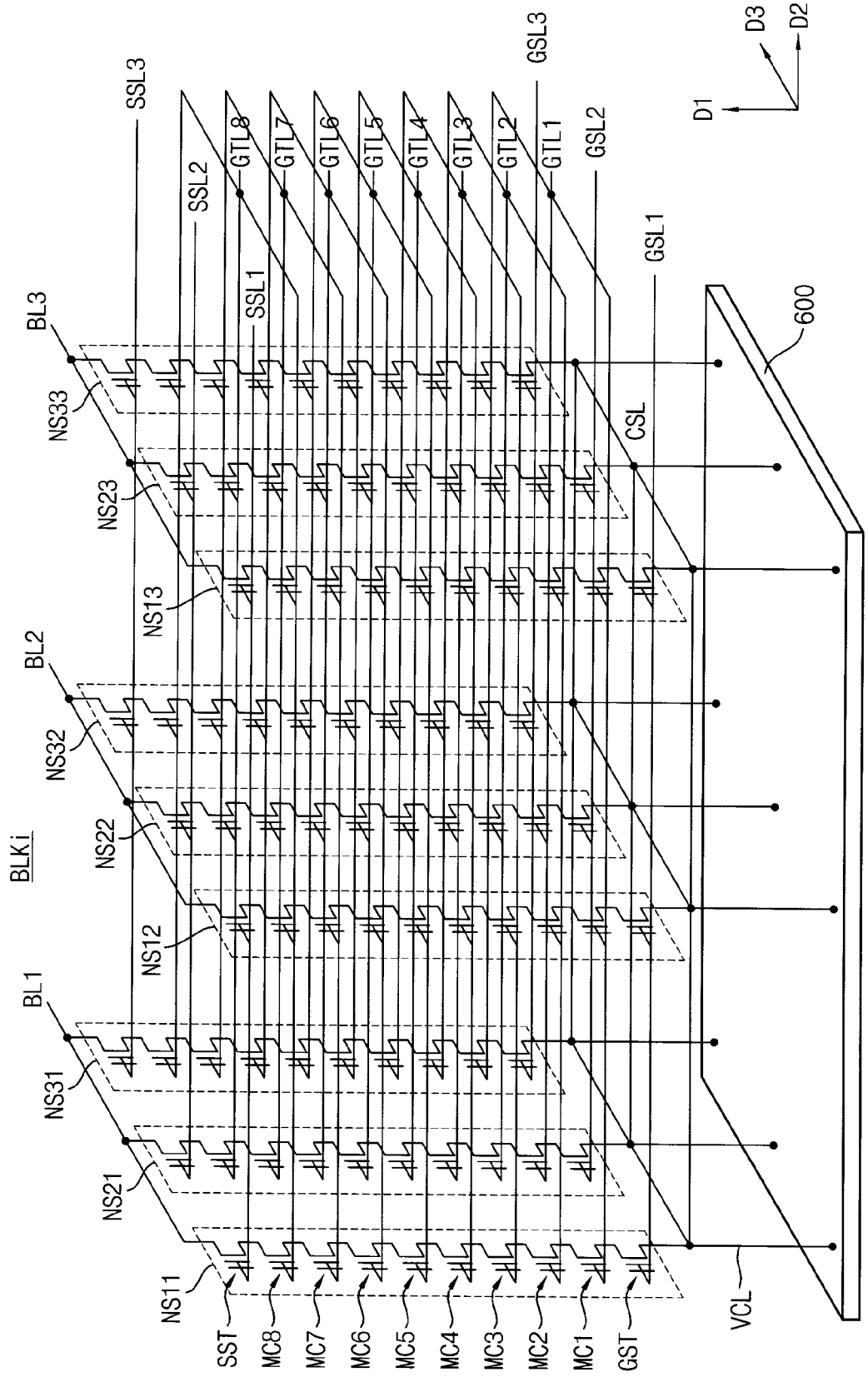
FIG. 8A illustrates a circuit diagram of an equivalent circuit of the memory block described with reference to FIG. 7.

FIG. 8A illustrates a circuit diagram of an equivalent circuit of the memory block described with reference to FIG. 7.

The memory block BLKi of FIG. 8A may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 8A, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. According to example embodiments, the ground selection transistor GST and the common source line CSL may be omitted. In FIG. 8A, each of the NAND strings NS11 to NS33 is illustrated as including eight memory cells MC1 to MC8. However, the number of memory cells in the NAND strings are not limited as shown in FIG. 8A, and in other embodiments each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. In FIG. 8A, the memory block BLKi is illustrated as including eight gate lines GTL1 to GTL8 and three bit lines BL1 to BL3. However, the number of gate lines and bit lines are not limited as shown in FIG. 8A, and in other embodiments each memory block in the memory cell array 400 may be coupled to any number of word lines and any number of bit lines.

As illustrated in FIG. 8A, an operation cell array 600 may be disposed below the memory block BLKi. The gate electrodes of the switching transistors (not shown) included in the operation cell array 600 may be connected to the NAND strings through vertical connection lines VCL.

Figure 8B:
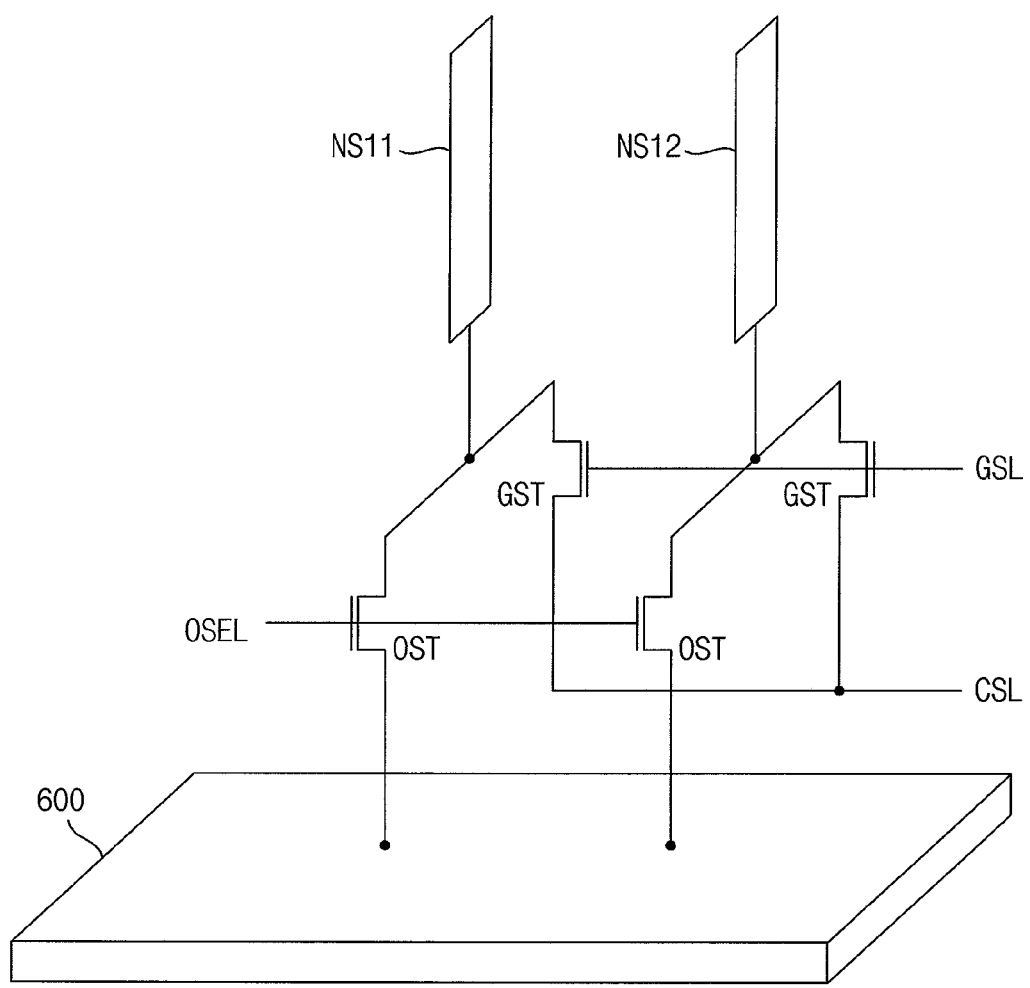
FIG. 8B illustrates a diagram of connections between NAND strings and an operation cell array according to embodiments of the inventive concepts.

FIG. 8B illustrates a diagram of connections between NAND strings and an operation cell array. For convenience of illustration, FIG. 8B illustrates only two NAND strings NS11 and NS12 that are simultaneously selected by the same string selection line.

Referring to FIG. 8B, the NAND strings NS11 and NS12 may be connected to the operation cell array 600 through operation selection transistors OST and connected to the common source line CSL through ground selection transistors GST.

When the processing in memory (PIM) method according to example embodiments is performed, a signal on an operation selection line OSEL may be activated and a signal on a ground selection line GSL may be deactivated. In this case, the operation selection transistors OST are turned on, the ground selection transistors GST are turned off and thus the NAND strings NS11 and NS12 may be electrically connected to the operation cell array 600.

In contrast, when normal operations of a nonvolatile memory device are performed using the common source line CSL, the signal on the operation selection line OSEL may be deactivated and the signal on the ground selection line GSL may be activated. In this case, the operation selection transistors OST are turned off, the ground selection transistors GST are turned on and thus the NAND strings NS11 and NS12 may be electrically connected to the common source line CSL.

Hereinafter, for convenience of illustration and description, a sensing multiplication operation and an analog addition operation are described with respect to one row. It should be readily understood that the same operations may be performed with respect to a plurality of rows. In other words, the sensing multiplication operation and the analog addition operation may be performed in parallel using a plurality of operation cell rows as described above, and description of such parallel operation is omitted from the following.

Figure 9:
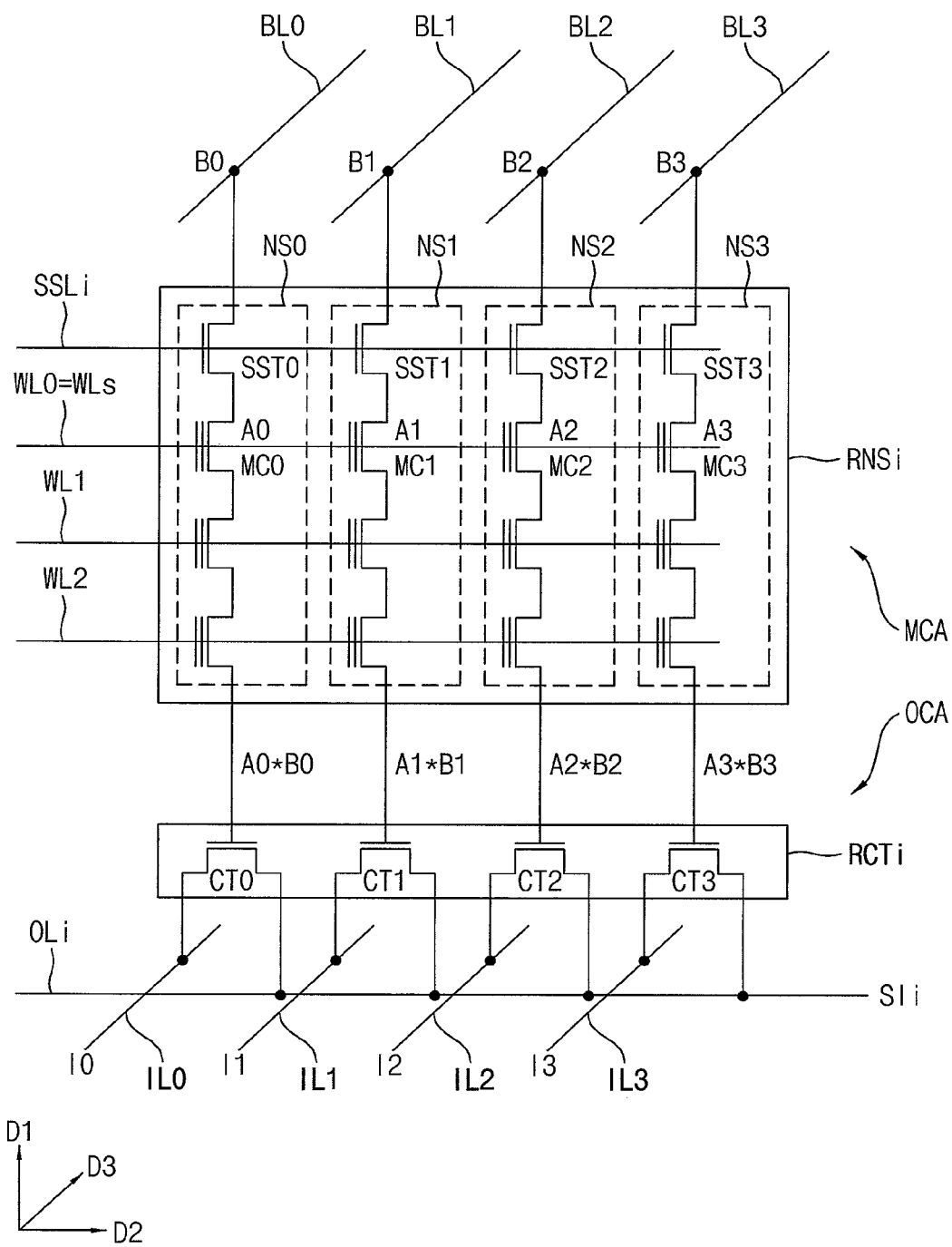
FIG. 9 illustrates a diagram descriptive of a sensing multiplication operation of a nonvolatile memory device according to embodiments of the inventive concepts.

FIG. 9 illustrates a diagram descriptive of a sensing multiplication operation of a nonvolatile memory device according to embodiments of the inventive concepts.

Referring to FIG. 9, multiplicand bits A0~A3 of multiplicand data may be stored in memory cells MC0~MC3 connected to a selected wordline WL (for example, a first wordline WL0). After that, multiplier bits B0~B3 of multiplier data may be loaded on bitlines BL0~BL3. The NAND strings NS0~NS3 may be electrically connected to the bitlines BL0~BL3 by applying a turn-on voltage to a string selection line SSLi to turn on string selection transistors SST0~SST3. In such states, a read sensing operation may be performed by applying a read voltage to the selected wordline WLs and applying a read pass voltage to the unselected wordlines WL1 and WL2 similarly as the normal read operation.

The memory cells MC0~MC3 are selectively turned on according to the multiplicand bits A0~A3, and thus multiplication bits Aj*Bj (j=0, 1, 2, 3) are applied to the gate electrodes of the switching transistors CT0~CT3 of the corresponding operation cell row RCTi, respectively, as will be further described with reference to an example of FIG. 10.

Figure 10:
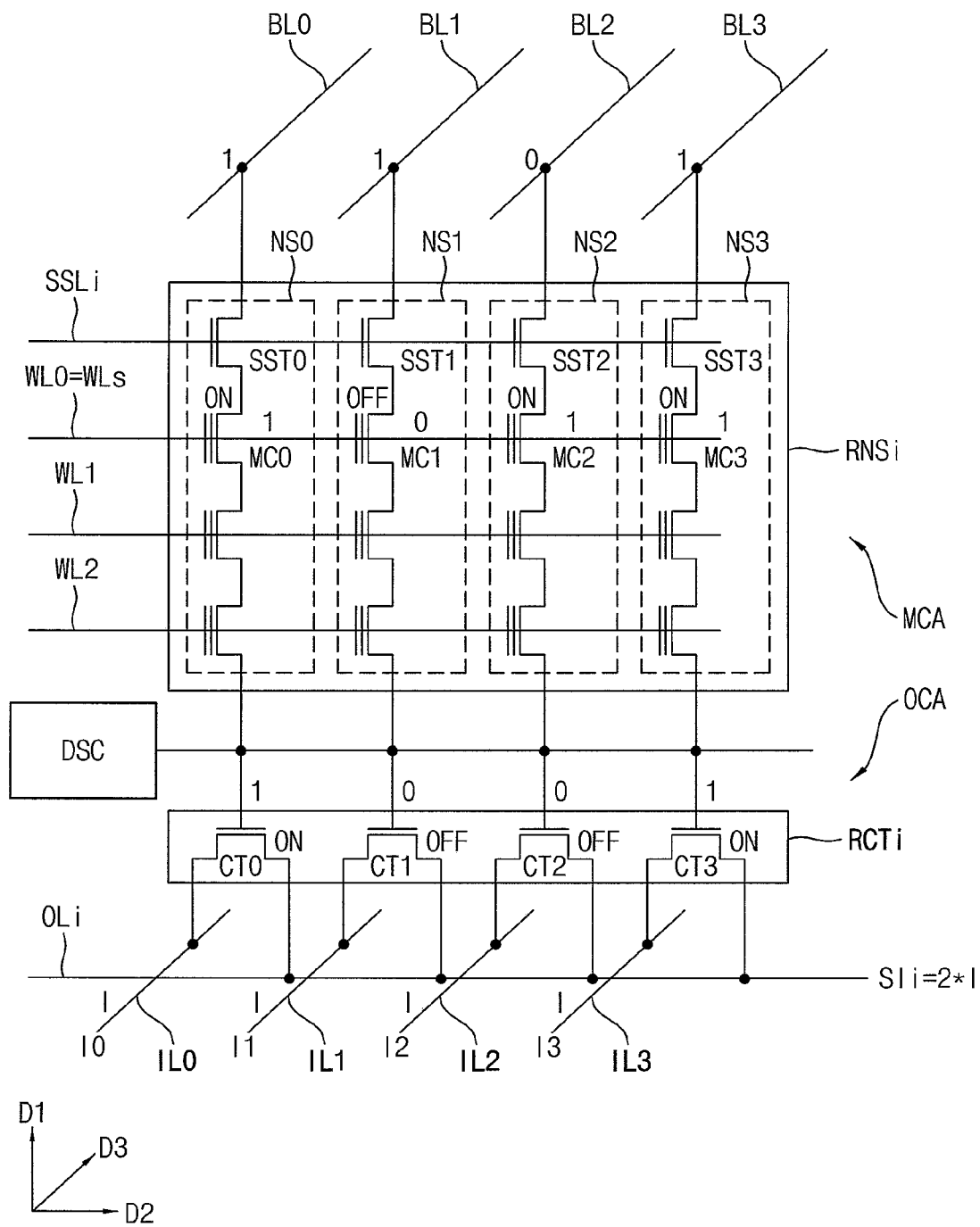
FIG. 10 illustrates a diagram descriptive of a normal addition operation of an operation cell array included in a nonvolatile memory device according to embodiments of the inventive concepts.

FIG. 10 illustrates a diagram descriptive of a normal addition operation of an operation cell array included in a nonvolatile memory device according to embodiments of the inventive concepts.

Referring to FIG. 10, for example, the multiplicand bits A0~A3 are "1, 0, 1, 1", and the multiplier bits B0~B3 are "1, 1, 0, 1". Before the above-described read sensing operation, the gate electrodes of the switching transistors CT0~CT3 may be precharged with a precharged voltage corresponding to a value of "0" using a precharge circuit DSC. In some example embodiments, the precharge circuit DSC may be included in the page buffer circuit 410 in FIG. 6.

When the read sensing operation is executed, the memory cells MC0, MC2 and MC3 having the value of "1" are turned on, and the memory cell MC1 having the value of "0" is turned off. Accordingly, the multiplier bits corresponding to the memory cells MC0, MC2 and MC3 having the value of "1" are applied to the gate electrodes of the switching transistors CT0, CT2 and CT3, and the gate electrode of the memory cell MC1 having the value of "0" maintains the precharge voltage corresponding to the value of "0".

As a result, the multiplication bits A0*B0~A3*B3 corresponding to the bitwise multiplications of the multiplicand bits A0~A3 and the multiplier bits B0~B2, that is, "1, 0, 0, 1" are applied to the gate electrodes of the switching transistors CT0~CT3. As such, the bitwise multiplications may be performed automatically by the read sensing operation, which may be referred to as the sensing multiplication operation.

The input current generator 500 in FIG. 2 may generate the plurality of input currents I0~I3 to have an equal magnitude (for example, I) with respect to each other and each operation cell row RCTi of the operation cell array OCA may perform a normal addition operation to generate the output current SIi corresponding to a normal sum of the multiplication bits.

For example, as illustrated in FIG. 10, when the multiplication bits A0*B0~A3*B3 applied to the gate electrodes of the switching transistors CT0~CT3 are "1, 0, 0, 1", the output current SIi is 2*I.

In general, in the normal addition operation using the input currents having the same magnitude, the output current SIi is N*I where N is the number of the multiplication bits having the value of "1" with respect to the corresponding operation cell row RCTi.

Figure 11:
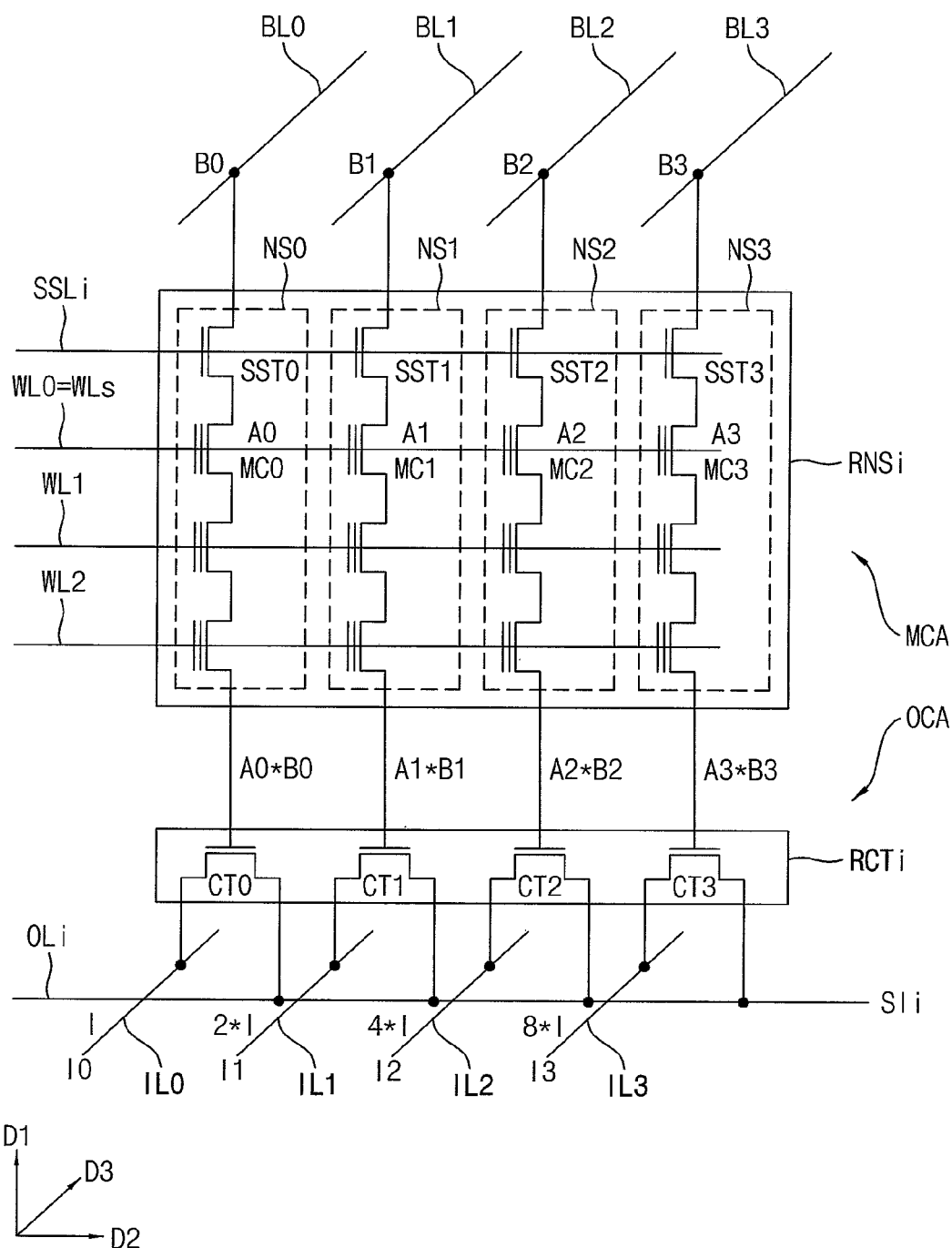
FIG. 11 illustrates a diagram descriptive of a weighted addition operation of an operation cell array included in a nonvolatile memory device according to embodiments of the inventive concepts.
Figure 12:
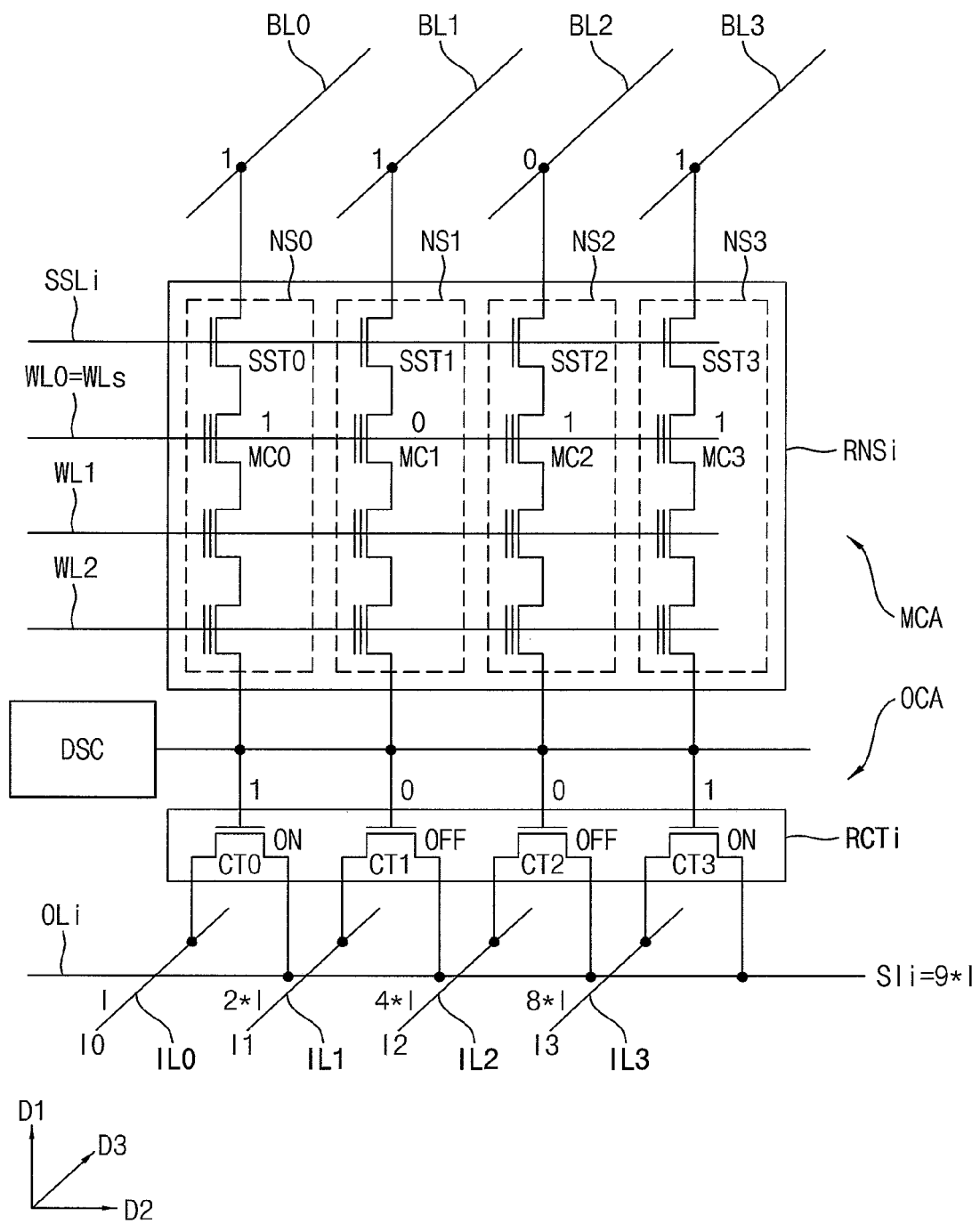
FIG. 12 illustrates a diagram descriptive of a weighted addition operation of an operation cell array included in a nonvolatile memory device according to embodiments of the inventive concepts.

FIGS. 11 and 12 illustrate diagrams descriptive of a weighted addition operation of an operation cell array included in a nonvolatile memory device according to embodiments of the inventive concepts.

In some example embodiments, the input current generator 500 in FIG. 2 may generate the plurality of input currents I0~I3 to have different magnitudes corresponding to different weight values, and each operation cell row RCTi of the operation cell array OCA may perform a weighted addition operation to generate a weighed sum of the multiplication bits multiplied by the different weight values.

In some example embodiments, as illustrated in FIG. 11, the different weight values correspond to different powers of two. That is, each input current may be a form of $I*2^j$. In this case, each output current SIi may be represented by Expression1.

$$SIi=I*\{A0*B0*2^0+A1*B1*2^1+A2*B2*2^2+A3*B3*2^3\}=I*\text{SUM}j\{Aj*Bj*2^j\}$$ Expression1

As a result, the binary current magnitude represented by the multiplication bits may be converted to the decimal current magnitude as represented by Expression1.

For example, as illustrated in FIG. 12, when the multiplication bits A0*B0~A3*B3 applied to the gate electrodes of the switching transistors CT0~CT3 are "1, 0, 0, 1", the output current SIi is $I*\{1*2^0+0*2^1+0*2^2+1*2^3\}=9*I$.

Figure 13:
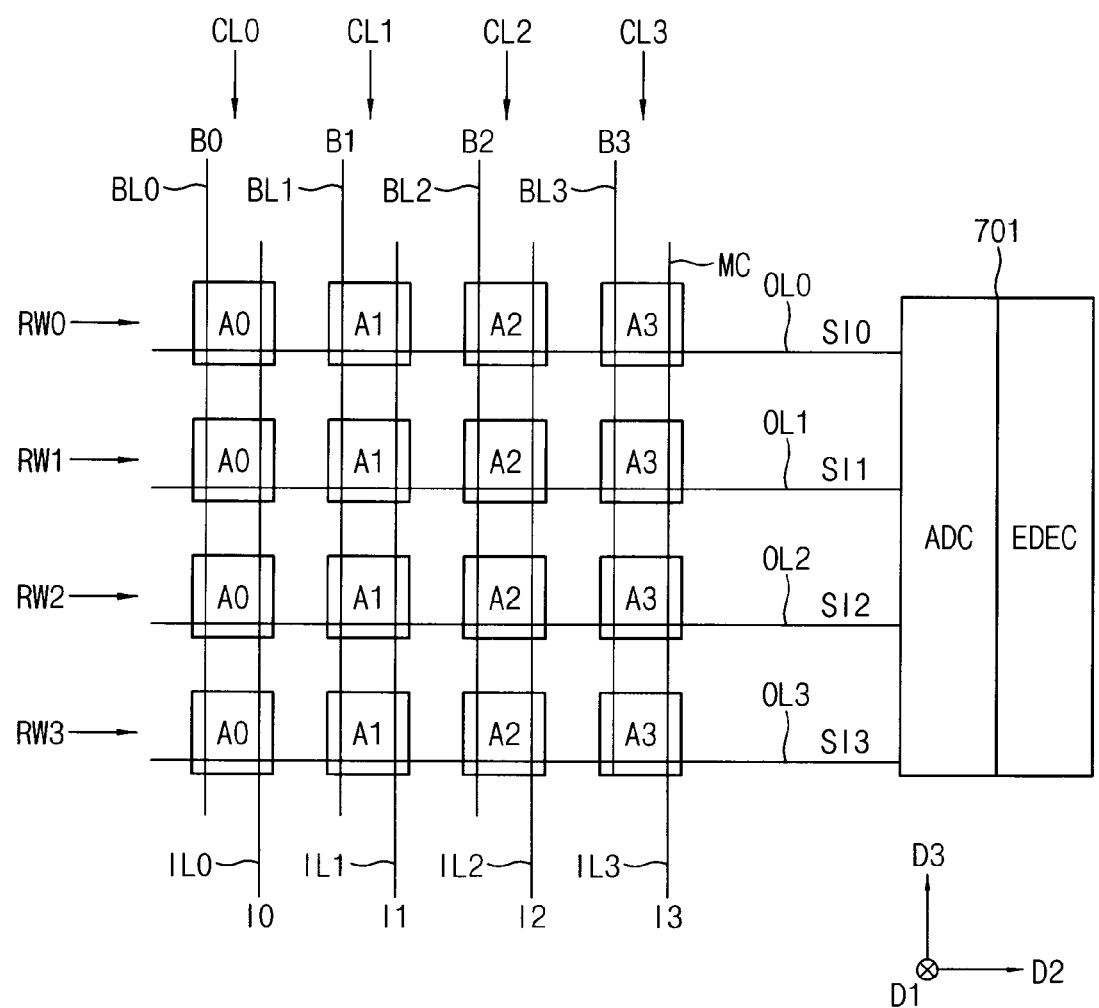
FIG. 13 illustrates a diagram of a processing in memory (PIM) method by a nonvolatile memory device according to example embodiments.

FIG. 13 illustrates a diagram of a processing in memory (PIM) method by a nonvolatile memory device according to embodiments of the inventive concepts.

Through the sensing multiplication operation according to example embodiments, the multiplication bits of the multiplicand bits stored in the memory cells and the multiplier bits loaded on the bitlines are output via the second ends of the NAND strings. Thus it is difficult to implement an error check code (or error check and correction) (ECC) operation with respect to the data stored in the memory cells.

To support the ECC function, the multiplicand data (that is, the multiplicand bits A0~A3) may be stored repeatedly in the memory cells. For example, as illustrated in FIG. 13, each of the multiplicand bits A0~A3 may be stored repeatedly in the memory cells of each of the columns CL0~CL3. In this case, based on the plurality of output currents SI0~SI3 corresponding to the plurality of rows RW0~RW3, the nonvolatile memory device may determine whether the NAND strings corresponding to the plurality of rows include defective memory cells.

The operation circuit 701 may include a digital-to-analog converter ADC and an error detector EDEC. The digital-to-analog converter ADC converts the plurality of output currents SI0~SI3 to a plurality of digital values. The error detector EDEC may determine the existence of the defective memory cells based on the plurality of digital values. For example, the error detector EDEC may determine that there is no defective memory cell when all of the digital values are equal. In contrast, when a minority of the digital values is different from the rest majority digital values (e.g., when one of the digital values is different than the other digital values) the error detector EDEC may determine that the rows corresponding to the minority digital value includes the defective memory cell. As the number of repeated storage, that is the number of bit copy, is increased, a resolution for sensing the summed current by the analog addition operation increases, and thus performance of the ECC function may be enhanced.

Figure 14:
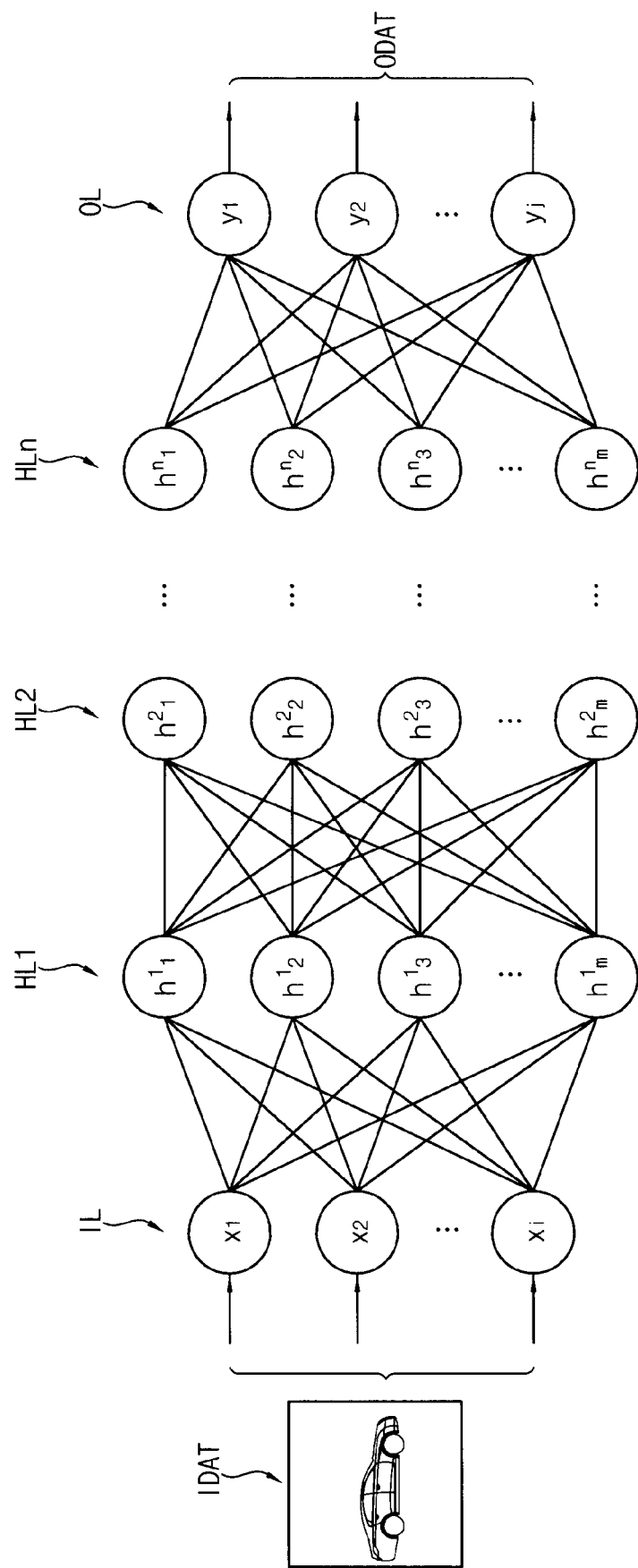
FIG. 14 illustrates a diagram descriptive of an example of a deep learning neural network structure that is driven by an artificial neural network (ANN) system using a memory device according to one or more embodiments of the inventive concepts.

FIG. 14 illustrates a diagram descriptive of a deep learning neural network structure that is driven by an artificial neural network (ANN) system using a memory device according to one or more embodiments of the inventive concepts.

Referring to FIG. 14, a general neural network may include an input layer IL, a plurality of hidden layers HL1, HL2, ..., HLn and an output layer OL. The input layer IL may include i input nodes x1, x2, ..., xi, where i is a natural number. Input data (e.g., vector input data) IDAT whose length is i may be input to the input nodes x1, x2, ..., xi such that each element of the input data IDAT is input to a respective one of the input nodes x1, x2, ..., xi.

The plurality of hidden layers HL1, HL2, ..., HLn may include n hidden layers, where n is a natural number, and may include a plurality of hidden nodes $h^1 1$, $h^1 2$, $h^1 3$, ..., $h^1 m$, $h^2 1$, $h^2 2$, $h^2 3$, ..., $h^2 m$, $h''1$, $h''2$, $h''3$, ..., $h''m$. For convenience, hereinafter $h^i_j$ may be represented by hij. For example, the hidden layer HL1 may include m hidden nodes h11, h12, h13, ..., h1$m$, the hidden layer HL2 may include m hidden nodes h21, h22, h23, ..., h2$m$, and the hidden layer HLn may include m hidden nodes hn1, hn2, hn3, ..., hnm, where m is a natural number.

The output layer OL may include j output nodes y1, y2, ..., yj, where j is a natural number. Each of the output nodes y1, y2, ..., yj may correspond to a respective one of classes to be categorized. The output layer OL may output the output values ODAT (e.g., class scores or simply scores) associated with the input data IDAT for each of the classes. The output layer OL may be referred to as a fully-connected layer and may indicate, for example, a probability that the input data IDAT corresponds to a car.

A structure of the neural network illustrated in FIG. 14 may be represented by information on branches (or connections) between nodes illustrated as lines, and a weighted value assigned to each branch. Nodes within one layer may not be connected to one another, but nodes of different layers may be fully or partially connected to one another.

Each node (e.g., the node h11) may receive an output of a previous node (e.g., the node x1), may perform a computing operation, computation or calculation on the received output, and may output a result of the computing operation, computation or calculation as an output to a next node (e.g., the node h21). Each node may calculate a value to be output by applying the input to a specific function, e.g., a nonlinear function.

Generally, the structure of the neural network may be set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

The general neural network illustrated in FIG. 14 may not be suitable for handling input image data (or input sound data) because each node (e.g., the node h11) is connected to all nodes of a previous layer (e.g., the nodes x1, x2, ..., xi included in the layer IL), and then the number of weighted values drastically increases as the size of the input image data increases. Thus, a convolutional neural network (CNN), which is implemented by combining a filtering technique with the general neural network, has been researched such that two-dimensional image (e.g., the input image data) is efficiently trained by the convolutional neural network.

As such, the deep learning neural network structure may include a plurality of layers, and a matrix multiplication and/or a matrix-vector multiplication may be required with respect to each layer.

FIG. 15 illustrates a diagram of an example of a matrix multiplication.

As illustrated in FIG. 15, (i, k) each of p*r*q (i, k, j) multiplication values Wik*Xkj may be determined by multiplying a multiplicand value Wik included in a multiplicand matrix MW of p rows and r columns and a (k, j) multiplier value Mkj included in a multiplier matrix of r rows and q columns, with respect to all of i, k and j where i is a natural number from 1 to p, k is a natural number from 1 to r and j is a natural number from 1 to q.

Each of p*q (i, j) component values Yij included in a multiplication matrix MY of p rows and q columns corresponding to a multiplication of the multiplicand matrix MW and the multiplier matrix MX may be determined by summing the r (i, k, j) multiplication values Wik*Xkj with respect to all of k.

The determination of the p*r*q (i, k, j) multiplication values Wik*Xkj corresponds to scalar multiplication, and thus the determination of each multiplication value may be performed by the above-described sensing multiplication operation and the weighted addition operation as described with reference to FIGS. 11 and 12.

Figure 16:
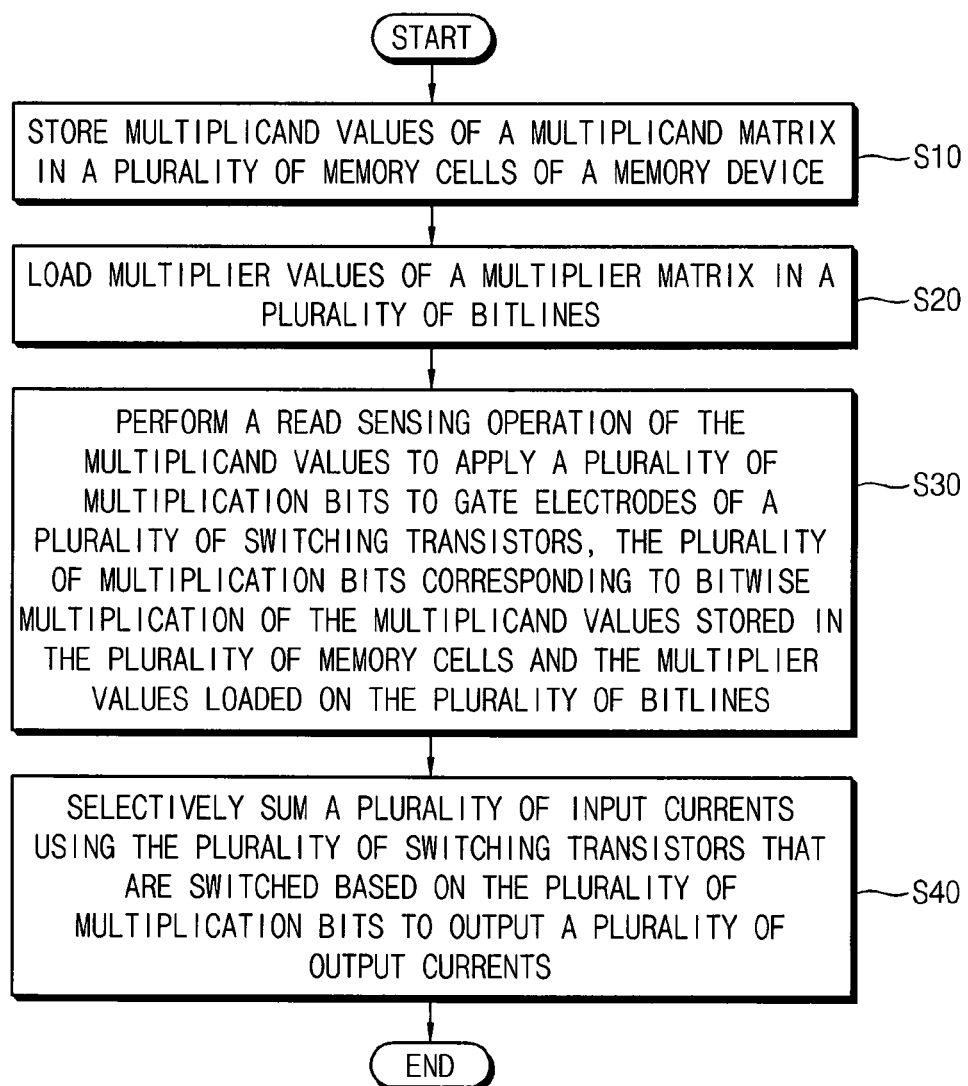
FIG. 16 illustrates a flow chart of a matrix multiplication method using a nonvolatile memory device according to embodiments of the inventive concepts.

FIG. 16 illustrates flow chart of a matrix multiplication method using a nonvolatile memory device according to embodiments of the inventive concepts.

Referring to FIG. 16, multiplicand values of a multiplicand matrix stored in a plurality of memory cells of a memory device (S10). The memory cells may for example correspond to memory cells within memory cell array (MCA) as shown in FIGS. 2 and 3. Multiplier values of a multiplier matrix are loaded in a plurality of bitlines (S20). The bitlines may for example correspond to bitlines such as bitlines BL0~BL3 shown in FIG. 3. A read sensing operation of the multiplicand values is performed to apply a plurality of multiplication bits to gate electrodes of a plurality of switching transistors, where the plurality of multiplication bits correspond to bitwise multiplication of the multiplicand values stored in the plurality of memory cells and the multiplier values loaded on the plurality of bitlines (S30). A plurality of input currents are selectively summed using the plurality of switching transistors that are switched based on the plurality of multiplication bits to output a plurality of output currents (S40). The switching transistors may for example correspond to switching transistors such as switching transistors CT0~CT3 shown in FIG. 3. The component values of the multiplication matrix of the multiplicand matrix and the multiplier matrix may be determined using analog-to-digital converters, weighted adders and accumulators as will be described with reference to FIGS. 18 and 19.

Figure 17:
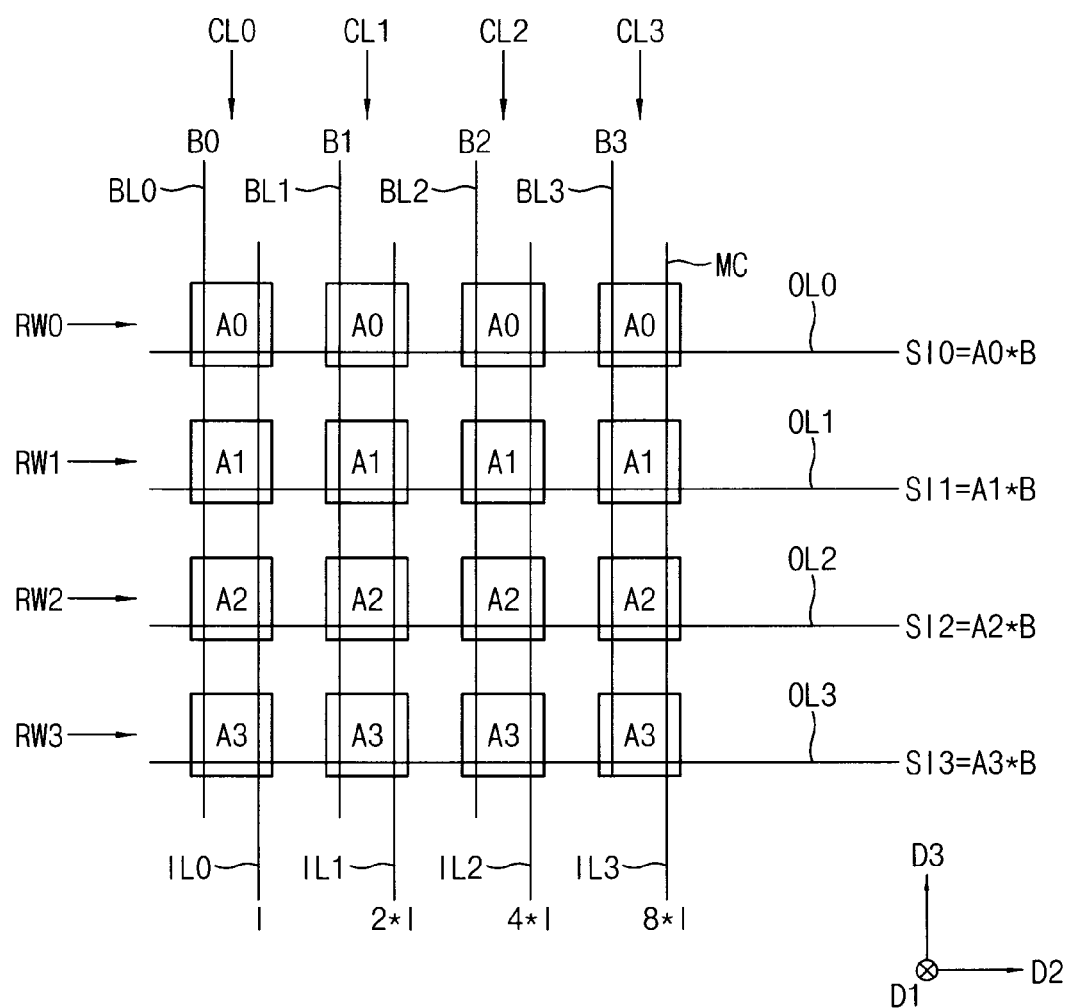
FIG. 17 illustrates a diagram of a processing in memory (PIM) method by a nonvolatile memory device according to embodiments of the inventive concepts.

FIG. 17 illustrates a diagram of a processing in memory (PIM) method by a nonvolatile memory device according to embodiments of the inventive concepts.

FIG. 17 illustrates an example method of storing and loading data, and a method of applying input currents to obtain one multiplication value of one multiplicand value having multiplicand bits A0~A3 and one multiplier value having multiplier bits B0~B3.

The input current generator 500 in FIG. 2 may generate a plurality of input currents IL0~IL3 that have different magnitudes I, 2*I, 4*I and 8*I corresponding to respective different weight values $2^0$, $2^1$, $2^2$ and $2^3$. The multiplicand bits A0~A3 may be stored repeatedly in memory cells MC corresponding to a plurality of rows RW0~RW3. For example, multiplicand data (i.e., multiplicand bits) are stored repeatedly in the NAND strings corresponding to n rows, where n is a natural number greater than one. In other words, each of the multiplicand bits A0~A3 may be stored repeated in the memory cells of each of a plurality of columns CL0~CL3.

The operation cell array 600 in FIG. 2 may generate a plurality of output currents OL0~OL3 corresponding to intermediate multiplication values A0*B~A3*B where the intermediate multiplication values A0*B~A3*B correspond to multiplications of each of the multiplicand bits A0~A3 and the multiplier values B. The output currents OL0~OL3 may be represented by Expression2.

$$SI0=I*\{A0*B0*2^0+A0*B1*2^1+A0*B2*2^2+A0*B3*2^3\}=I*A0*B$$

$$SI1=I*\{A1*B0*2^0+A1*B1*2^1+A1*B2*2^2+A1*B3*2^3\}=I*A1*B$$

$$SI2=I*\{A2*B0*2^0+A2*B1*2^1+A2*B2*2^2+A2*B3*2^3\}=I*A2*B$$

$$SI3=I*\{A3*B0*2^0+A3*B1*2^1+A3*B2*2^2+A3*B3*2^3\}=I*A3*B \quad \text{Expression2}$$

In Expression2, B is the decimal value corresponding to the binary representation B3B2B1B0 of the multiplier value comprised of four multiplier bits B0~B3. The decimal multiplication value A*B of the decimal multiplicand value A and the decimal multiplier value B may be represented by Expression3.

$$A*B=A0*B*2^0+A1*B*2^1+A2*B*2^2+A3*B*2^3=\text{SUM}j\{Aj*B*2^i\} \quad \text{Expression3}$$

In Expression3, Aj*B may be referred to as the intermediate multiplication values, and the decimal multiplication value A*B may be obtained by multiplying bit weights $2^j$ to the intermediate multiplication values Aj*B and summing the weighted values $Aj*B*2^i$. Each of the intermediate multiplication values Aj*B of Expression2 may be provided to the analog-to-digital converter and the weighted addition of Expression3 may be performed by the weighted adders in FIGS. 18 and 19.

Figure 18:
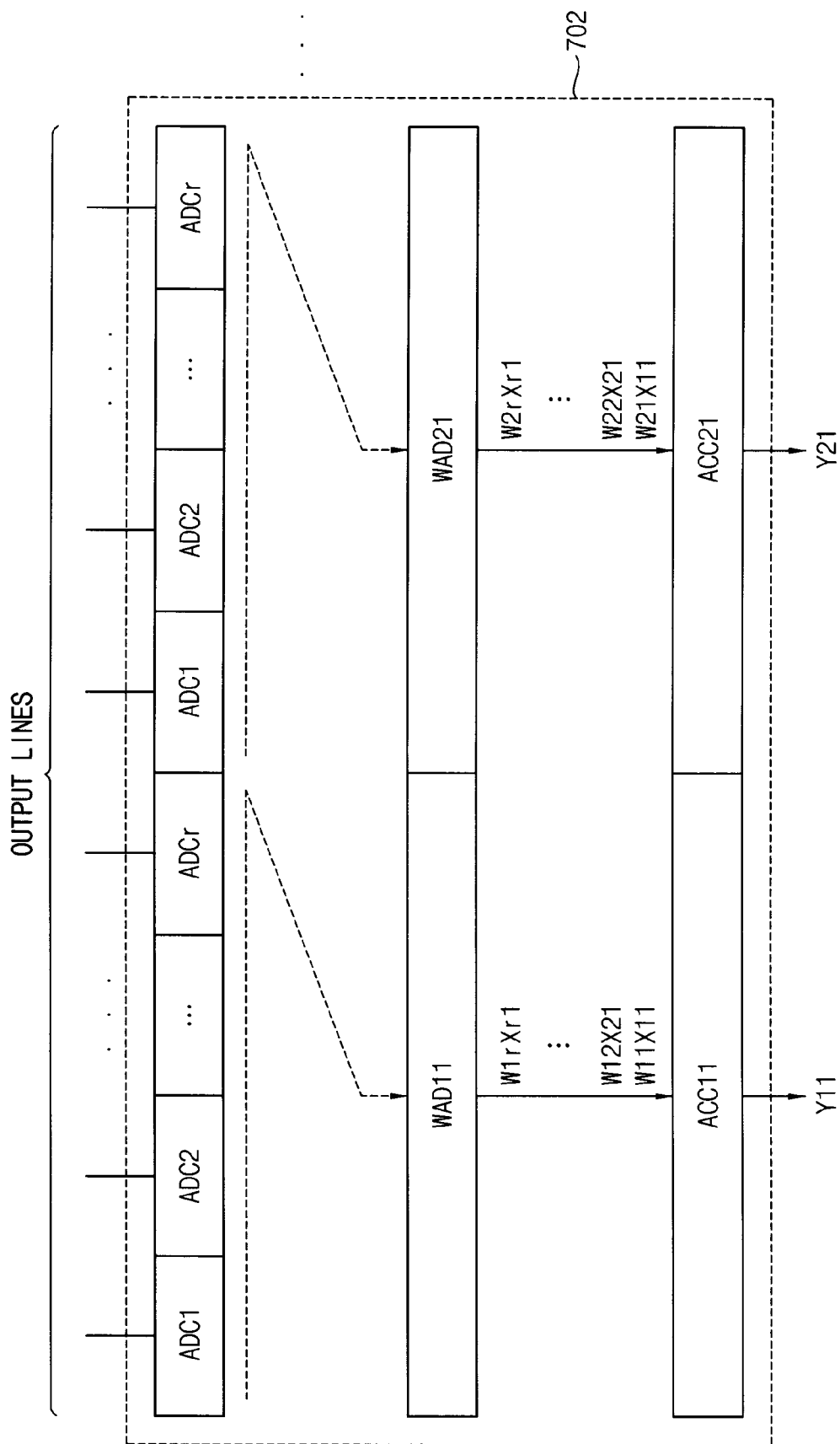
FIG. 18 illustrates a diagram of an operation circuit included in a nonvolatile memory device according to embodiments of the inventive concepts.
Figure 19:
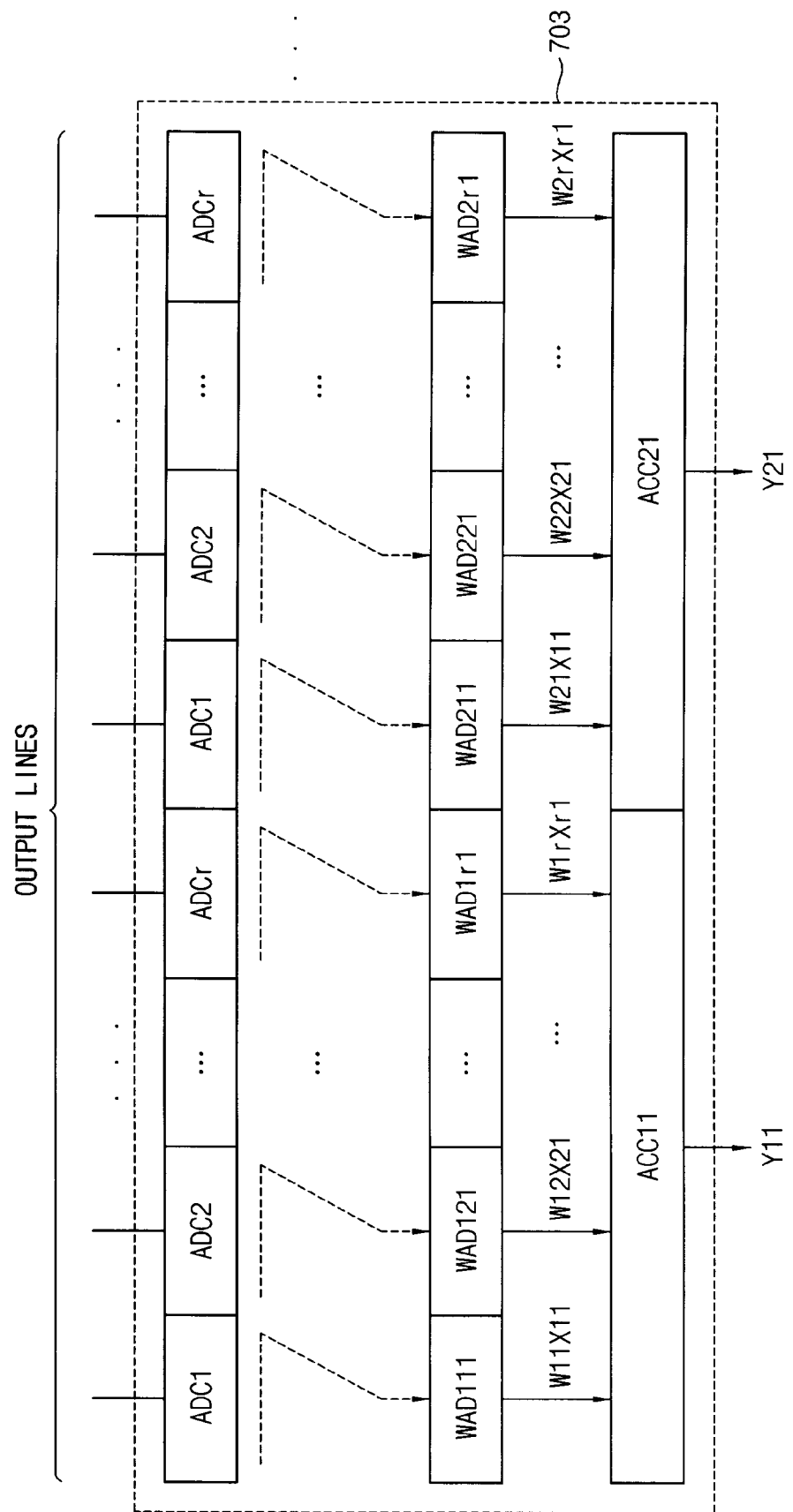
FIG. 19 illustrates a diagram of an operation circuit included in a nonvolatile memory device according to embodiments of the inventive concepts.

FIGS. 18 and 19 illustrate diagrams of an operation circuit included in a nonvolatile memory device according to embodiments of the inventive concepts.

In FIGS. 18 and 19, r analog-to-digital converters ADC1~ADCr are arranged repeatedly. That is, as shown in FIGS. 18 and 19, analog-to-digital converters ADC1, ADC2, . . . , and ADCr are arranged sequentially, followed by analog-to-digital converters ADC1, ADC2, . . . , and ADCr are arranged sequentially. The r analog-to-digital converters ADC1~ADCr correspond to one component value Yij of the multiplication matrix MY that is the result of the matrix multiplication of FIG. 15. For convenience of illustration, FIGS. 18 and 19 illustrate configurations corresponding to the two component values Y11 and Y21.

Referring to FIG. 18, an operation circuit 702 may include a plurality of weighted adders WAD11 and WAD21 and a plurality of accumulators ACC11 and ACC21.

The r (i, k, j) multiplication values Wi1*X1j~Wir*Xrj with respect to each of i and each of j are sequentially determined using one weighted adder included in the nonvolatile memory device. In other words, the r multiplication values W11*X11~W1r*Xr1 are sequentially determined using the weighted adder WAD11, and the r multiplication values W21*X11~W2r*Xr1 are sequentially determined using the weighted adder WAD21.

The p*q (i, j) component values Y11~Ypq are determined in parallel using p*q accumulators included in the memory device. For example, as illustrated in FIG. 18, the two component values Y11 and Y21 are determined in parallel using the two accumulators ACC11 and ACC21.

Referring to FIG. 19, an operation circuit 703 may include a plurality of weighted adders WAD111~WAD1r1 and WAD211~WAD2r1 and a plurality of accumulators ACC11 and ACC21.

The r (i, k, j) multiplication values Wi1*X1j~Wir*Xrj with respect to each of i and each of j are determined in parallel using r weighted adders included in the nonvolatile memory device. In other words, the r multiplication values W11*X11~W1r*Xr1 are determined in parallel using the r weighted adders WAD111~WAD1r1, and the r multiplication values W21*X11~W2r*Xr1 are determined in parallel using the r weighted adders WAD211~WAD2r1.

The p*q (i, j) component values Y11~Ypq are determined in parallel using p*q accumulators included in the memory device. For example, as illustrated in FIG. 19, the two component values Y11 and Y21 are determined in parallel using the two accumulators ACC11 and ACC21.

Figure 20:
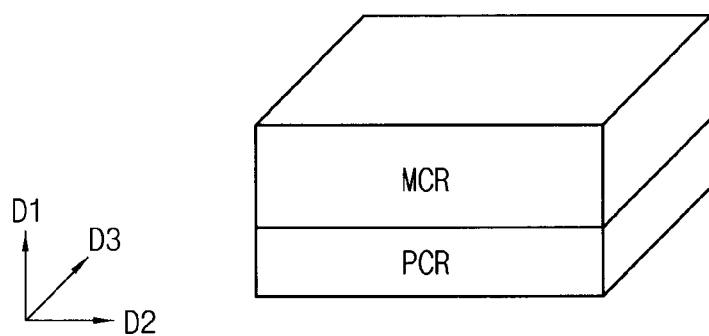
FIG. 20 illustrates a perspective view of a nonvolatile memory device according to embodiments of the inventive concepts.

FIG. 20 illustrates a perspective view of a nonvolatile memory device according to embodiments of the inventive concepts.

Referring to FIG. 20, a nonvolatile memory device may include a peripheral circuit region PCR in which a peripheral circuit is formed and a memory cell region MCR in which a memory cell array is formed.

The peripheral circuit region PCR may include a semiconductor substrate and a peripheral circuit formed at the semiconductor substrate, as will be described hereinafter. The memory cell region MCR may include a memory cell array. The operation cell array according to example embodiments may be formed in the peripheral circuit region PCR below the memory cell array.

Figure 21:
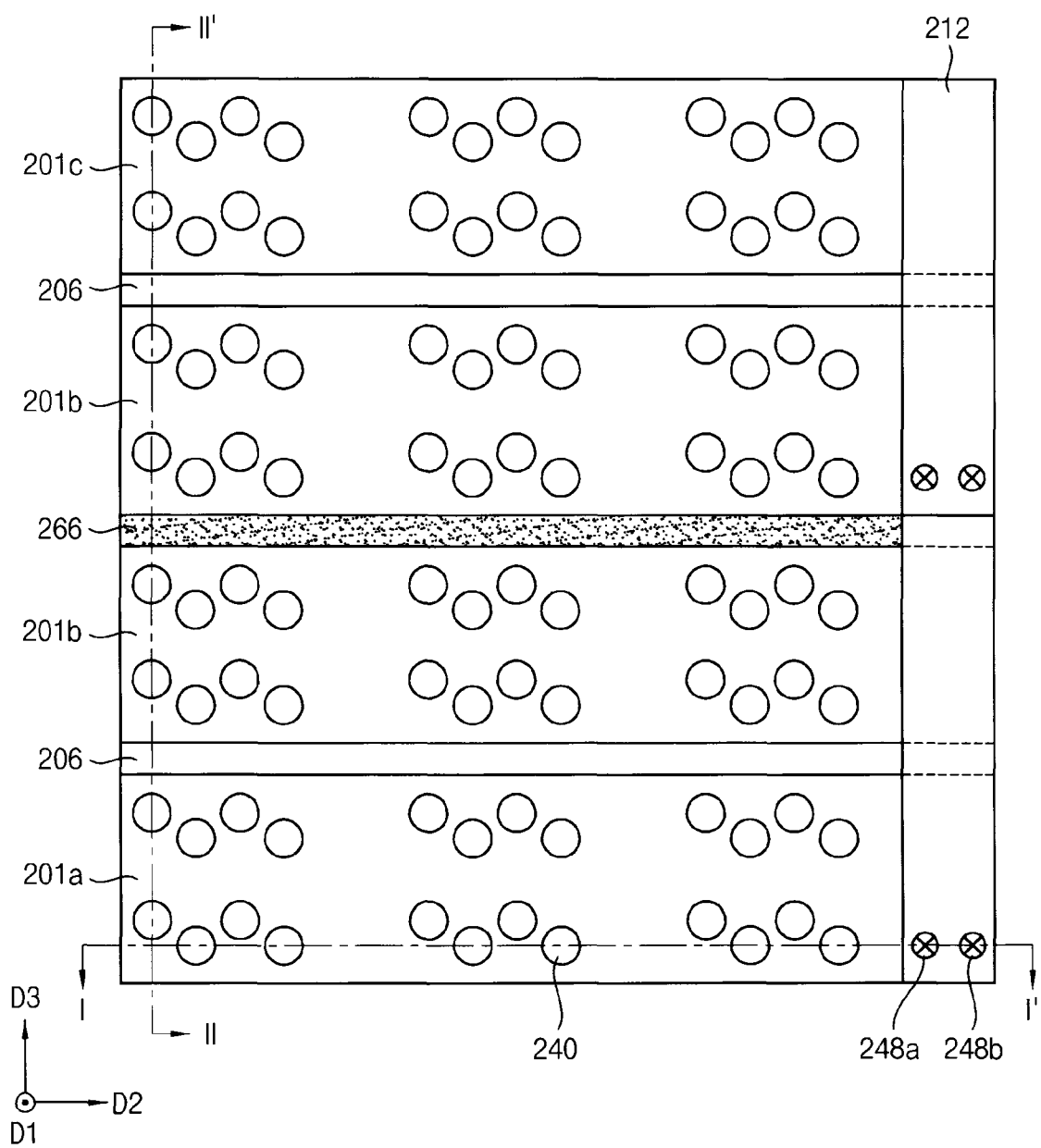
FIG. 21 illustrates a top view of a nonvolatile memory device according to embodiments of the inventive concepts.
Figure 22:
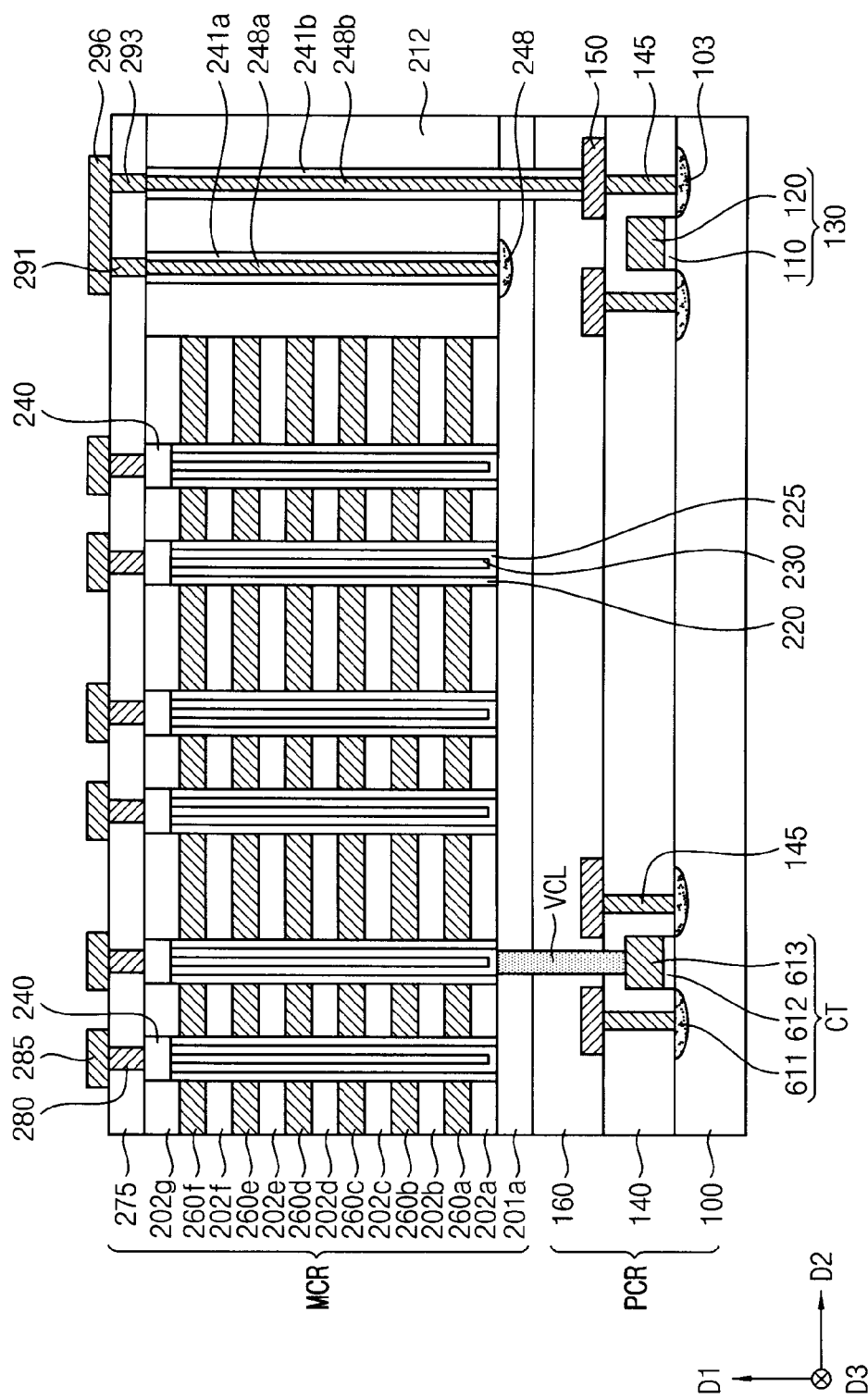
FIG. 22 illustrates a cross-sectional view taken along a line I-I' in FIG. 21.
Figure 23:
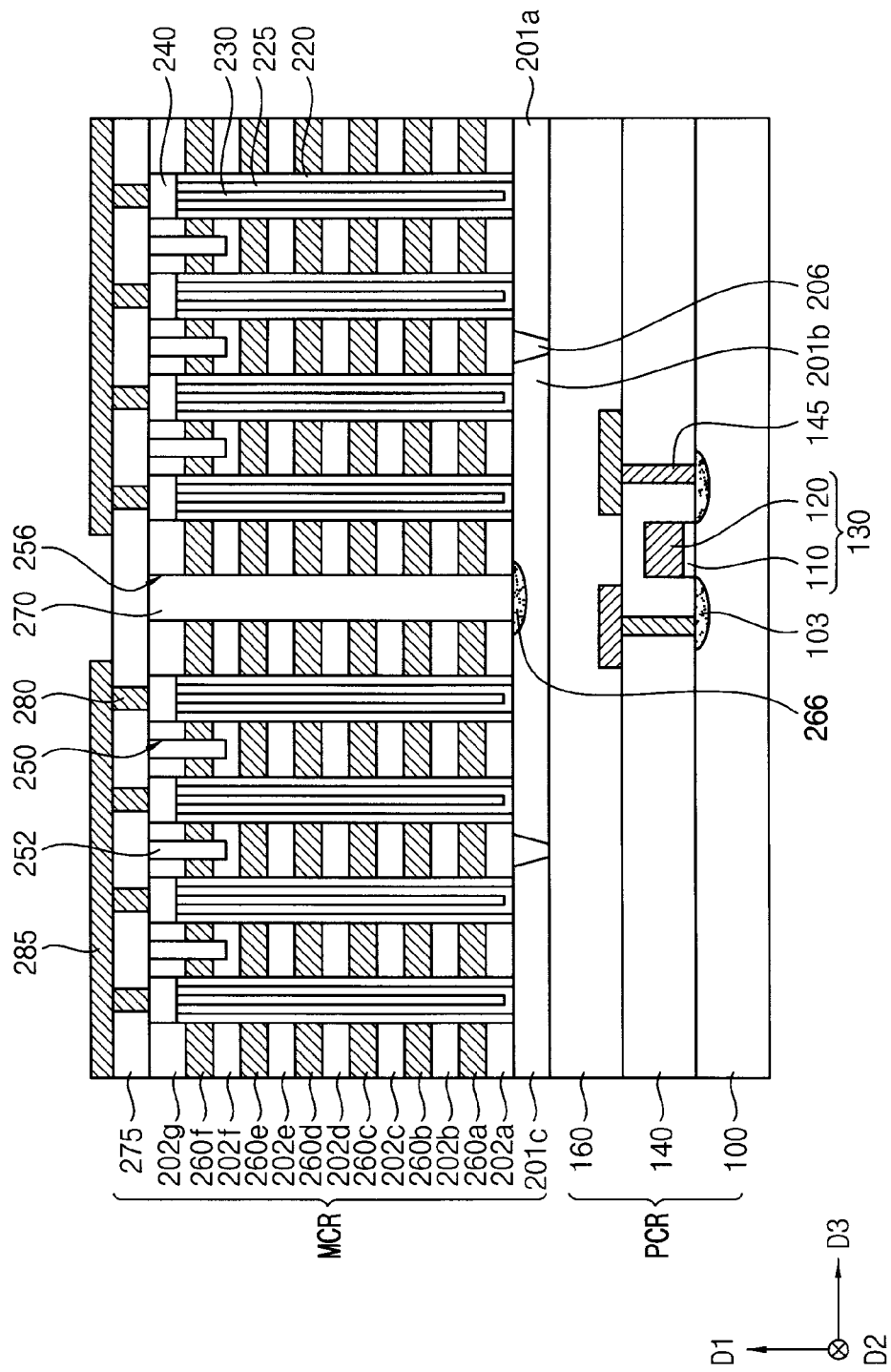
FIG. 23 illustrates a cross-sectional view taken along a line II-II' in FIG. 21.

FIG. 21 illustrates a top view of a nonvolatile memory device according to embodiments of the inventive concepts. FIG. 22 illustrates a cross-sectional view taken along a line I-I' in FIG. 21. FIG. 23 illustrates a cross-sectional view taken along a line II-II' in FIG. 21.

In some example embodiments, a non-volatile memory device may have a cell over periphery (COP) structure in which a memory cell structure is stacked on a peripheral circuit. The memory cell structure may have a vertical NAND flash memory device structure in which a plurality of NAND flash memory cells are formed vertically, e.g., in the first direction D1, with respect to a top surface of a substrate.

So as to provide a clear and concise description, some elements of the memory device are not shown in FIG. 21. For example, FIG. 21 illustrates base layer patterns 201a, 201b, and 201c, separation layer patterns 206, a second impurity region 266, a mold protection layer 212, a first connecting contact 248a, and a second connecting contact 248b. Other elements of the nonvolatile memory device as previously described are omitted.

Referring to FIGS. 21 to 23, the memory device may include the peripheral circuit region PCR including a peripheral circuit structure and the memory cell region MCR including a memory cell structure.

The peripheral circuit region PCR may include, e.g., a transistor including a gate structure 130 and a source/drain region 103 formed on a substrate 100, lower insulation layers 140 and 160, a lower contact 145, and lower wirings 150.

The substrate 100 may include a semiconductor material, e.g., single crystalline silicon or single crystalline germanium. The gate structure 130 may include a gate insulation layer pattern 110 and a gate electrode 120, which are stacked on the substrate 100. The transistor may be disposed on the substrate 100.

The gate insulation layer pattern 110 may include, e.g., silicon oxide or a metal oxide. The gate electrode 120 may include, e.g., a metal, a metal nitride, or doped polysilicon. The source/drain region 103 may include n-type or p-type impurities.

A first lower insulation layer 140 may be formed on the substrate 100 to cover a structure such as the transistor, and the lower contact 145 may extend through the first lower insulation layer 140 to be electrically connected to the source/drain region 103.

The lower wirings 150 may be disposed on the first lower insulation layer 140, and may be electrically connected to the lower contact 145. A second lower insulation layer 160 may be formed on the first lower insulation layer 140 to cover the lower wirings 150. FIG. 22 illustrates a non-limiting example where the lower wirings 150 are formed in the same layer, but the lower wirings 150 may be distributed in different wiring layers.

The first and second lower insulation layers 140 and 160 may include an insulating material, e.g., silicon oxide. The lower contact 145 and the lower wirings 150 may include, e.g., a metal, a metal nitride, or doped polysilicon.

The memory cell region MCR may include first to third base layer patterns 201a, 201b, and 201c, channels 225, gate lines 260 (i.e., 260a-260f), bit lines 285, and connecting wirings 296, etc.

The separation layer pattern 206 may extend in the second direction D2, and a plurality of the separation layer patterns 206 may be arranged along the third direction D3. Thus, a base layer may be physically divided into the first to third base layer patterns 201a, 201b, and 201c.

The channels 225 may be disposed on the base layer patterns 201a, 201b and 201c, and may extend in the first direction D1 from top surfaces of the base layer patterns 201a, 201b and 201c. The channels 225 may have a hollow cylindrical shape or a cup shape. A plurality of the channels 225 may be arranged in the second direction D2 to form a channel row, and a plurality of the channel rows may be arranged in the third direction D3. In some example embodiments, the channels 225 included in the neighboring channel rows may be arranged in a zigzag arrangement to face one another. Thus, a density of the channels 225 in a unit area of the base layer pattern 201a, 201b and 201c may be increased. A filling layer pattern 230 may be formed in an inner space of the channel 225. The filling layer pattern 230 may have a pillar shape or a solid cylindrical shape. The filling layer pattern 230 may include an insulation layer pattern, e.g., silicon oxide.

The gate lines 260 (e.g., 260a through 260o) may be disposed on an outer sidewall of the dielectric layer structure 220 and may be spaced apart from one another in the first direction D1. For example, a lowermost gate line 260a may serve as a ground selection line (GSL). Four gate lines 260b, 260c, 260d and 260e over the GSL may serve as word lines. An uppermost gate line 260f of the word lines may serve as a string selection line (SSL).

Insulating interlayers 202 (e.g., 202a to 202g) may be disposed between the gate lines 260 along the first direction D1. The gate lines 260 may be insulated from one another along the first direction D1 by the insulating interlayers 202.

A gate line cut region 256 may be formed through the gate lines 260 and the insulating interlayers 202 along the first direction D1. A gate line cut pattern 270 extending in the second direction D2 may be disposed on the second impurity region 266. A plurality of the second impurity regions 266 and the gate line cut patterns 270 may be arranged along the third direction D3.

In some example embodiments, a cell block sharing the gate lines 260 may be defined by the gate line cut pattern 270. The cell block may be divided into sub-cell blocks by the separation layer pattern 206.

In some embodiments, one of the second impurity regions 266 and one of the gate line cut patterns 270 may be provided per each base layer pattern 201a, 201b and 201c. As illustrated in FIG. 23, for example, the second impurity region 266 may be formed at a central region of the second base layer pattern 201b, and the gate line cut pattern 270 may be disposed on the second impurity region 266.

A connecting contact and a connecting wiring may be provided per each base layer pattern 201a, 201b and 201c to transfer an electrical signal and/or a voltage from a peripheral circuit. In example embodiments, the mold protection layer 212 may be formed on lateral portions of the base layer pattern 201a, 201b and 201c, and the separation layer pattern 206. The first connecting contact 248a may extend through the mold protection layer 212 to make contact with a first impurity region 248 formed at the lateral portion of the base layer pattern 201a, 201b and 201c. The second connecting contact 248b may extend through the mold protection layer 212, the base layer patterns 201a, 201b and 201c, and the second lower insulation layer 160 to make contact with the lower wiring 150. A first insulation layer pattern 241a and a second insulation layer pattern 241b may be formed on sidewalls of the first connecting contact 248a and the second connecting contact 248b, respectively.

A first plug 291 and a second plug 293 may extend through an upper insulation layer 275 to be in contact with the first connecting contact 248a and the second connecting contact 248b, respectively. The connecting wiring 296 may be disposed on the upper insulation layer 275 to electrically connect the first and second plugs 291 and 293. An upper gate line cut pattern 252 may be formed in an upper gate line cut region 250. The upper gate line cut pattern 252 may include an insulation material, e.g., silicon oxide.

In example embodiments, the upper gate line cut region 250 or the upper gate line cut pattern 252 may be provided for a separation of the SSL in each cell block. In this case, the upper gate line cut region 250 or the upper gate line cut pattern 252 may extend through an uppermost insulating interlayer 202g and the SSL 260f, and may extend partially through an insulating interlayer 202f directly under the SSL 260f.

The upper insulation layer 275 may be formed on the uppermost insulating interlayer 202g, the pad 240, the upper gate line cut pattern 252, the gate line cut pattern 270, the first connecting contact 248a and the second connecting contact 248b. A bit line contact 280 may be formed through the upper insulation layer 275 to make contact with the pad 240. A plurality of the bit line contacts 280 may be formed to define an array comparable to an arrangement of the channels 225 or the pads 240.

The bit line 285 may be disposed on the upper insulation layer 275 to be electrically connected to the bit line contact 280. For example, the bit line 285 may extend in the third direction D3 to be electrically connected to a plurality of the bit line contacts 280. The bit line 285 and the separation layer pattern 206 may extend in substantially the same direction.

For convenience of illustration, FIG. 22 illustrates one switching transistor CT that is connected to a channel of one NAND string. The switching transistor CT may include a source/drain region 611, a gate insulation layer pattern 612 and a gate electrode 613. Both of the source/drain regions 611 correspond to the above-describe first and second electrodes of the switching transistor CT. The source/drain region 611 may be connected to a lower wiring 150, that is, the corresponding input or output line, through the lower contact 145. The gate electrode 613 of the switching transistor CT may be connected to the channel of the corresponding NAND string through a vertical connection line VCL.

Figure 24:
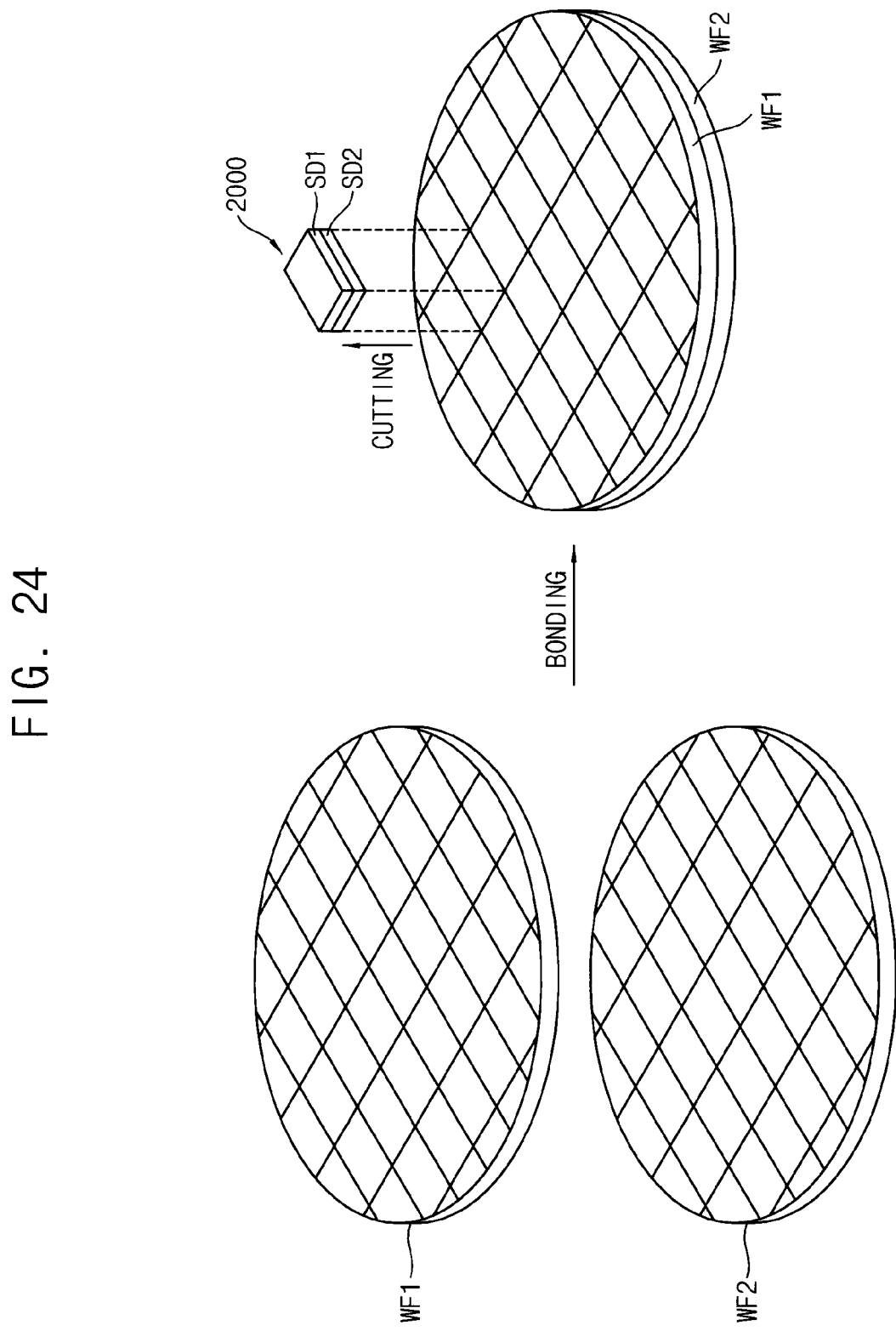
FIG. 24 illustrates a diagram descriptive of manufacturing processes of a stacked semiconductor device according to embodiments of the inventive concepts.

FIG. 24 illustrates a diagram descriptive of manufacturing processes of a stacked semiconductor device according to embodiments of the inventive concepts.

Referring to FIG. 24, a memory cell array including a plurality of NAND strings may be formed in a first wafer WF1 and an operation cell array as described above may be formed in a second wafer WF2. After the integrated circuits are formed in the first and second wafers WF1 and WF2, the first wafer WF1 and the second wafer WF2 are bonded to each other. The bonded wafers WF1 and WF2 are cut and divided into a plurality of chips, whereby each chip corresponds to a nonvolatile memory device 2000 including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to a second semiconductor die SD2.

As such, the nonvolatile memory device 2000 may have a bonding structure that includes the first semiconductor die SD1 in which the plurality of NAND strings are formed and the second semiconductor die SD2 in which the operation cell array is formed.

FIGS. 25 through 28 are diagrams illustrating layouts of a nonvolatile memory device according to embodiments of the inventive concepts.

FIGS. 25 through 28 illustrate example layouts LAYO1~LAYO4 with respect to NAND strings NS00~NS33 arranged in a plurality of rows and a plurality of columns, and switching transistors CT arranged in a plurality of rows and a plurality of columns.

Figure 25:
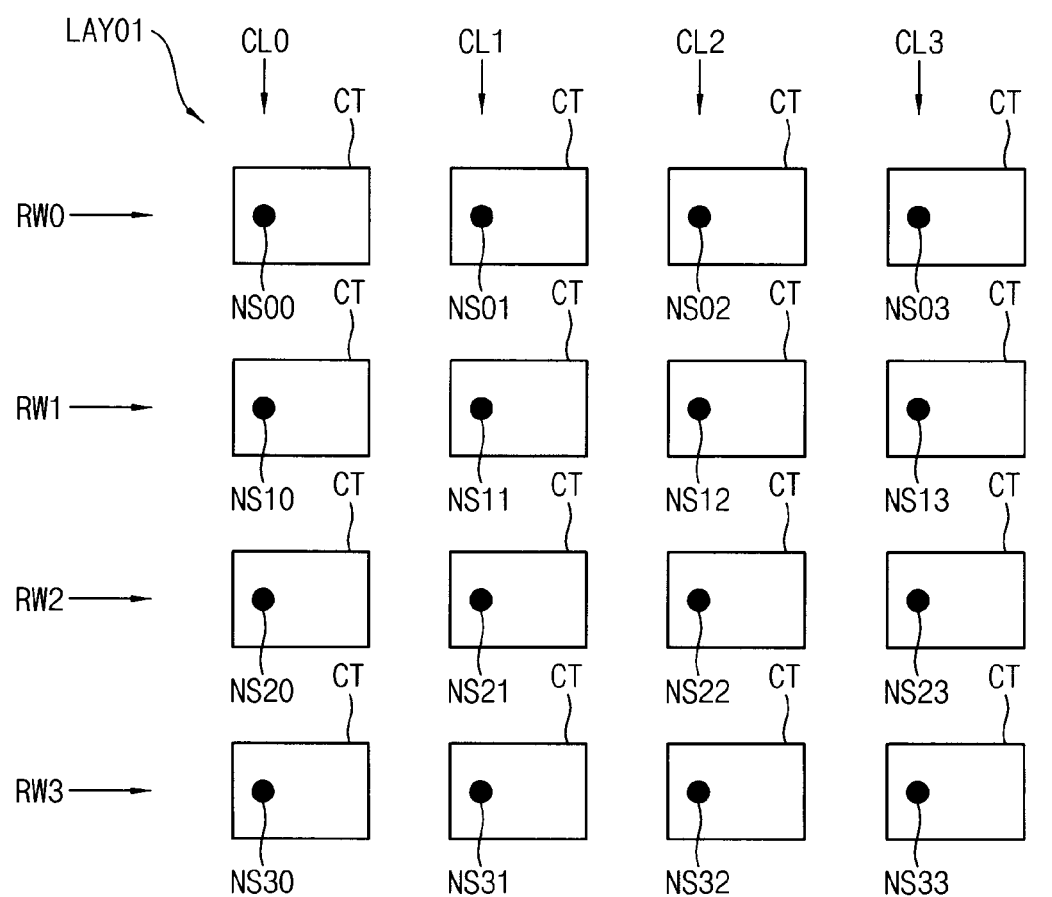
FIG. 25 illustrates a layout of a nonvolatile memory device according to embodiments of the inventive concepts.
Figure 26:
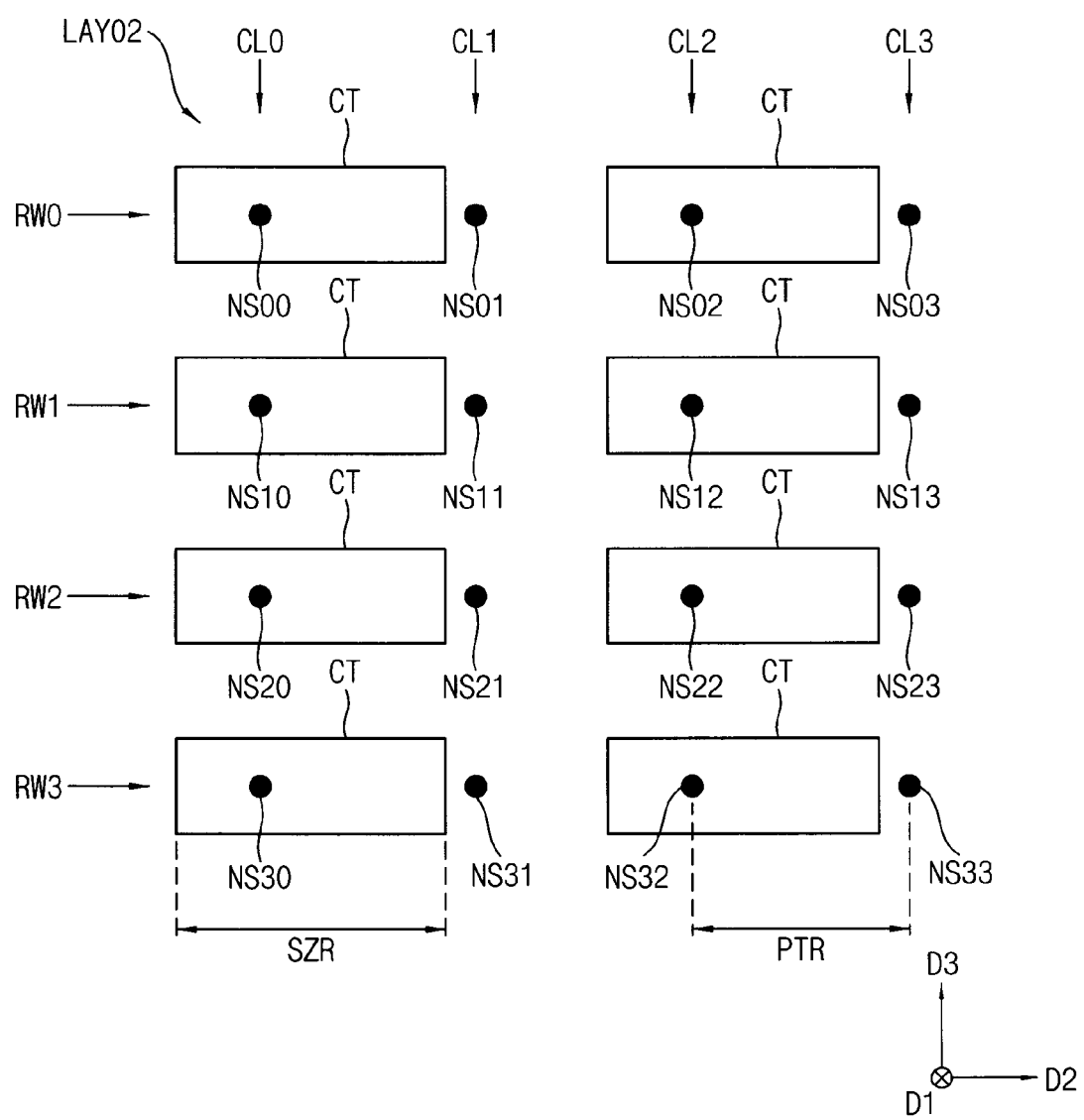
FIG. 26 illustrates a layout of a nonvolatile memory device according to embodiments of the inventive concepts.
Figure 27:
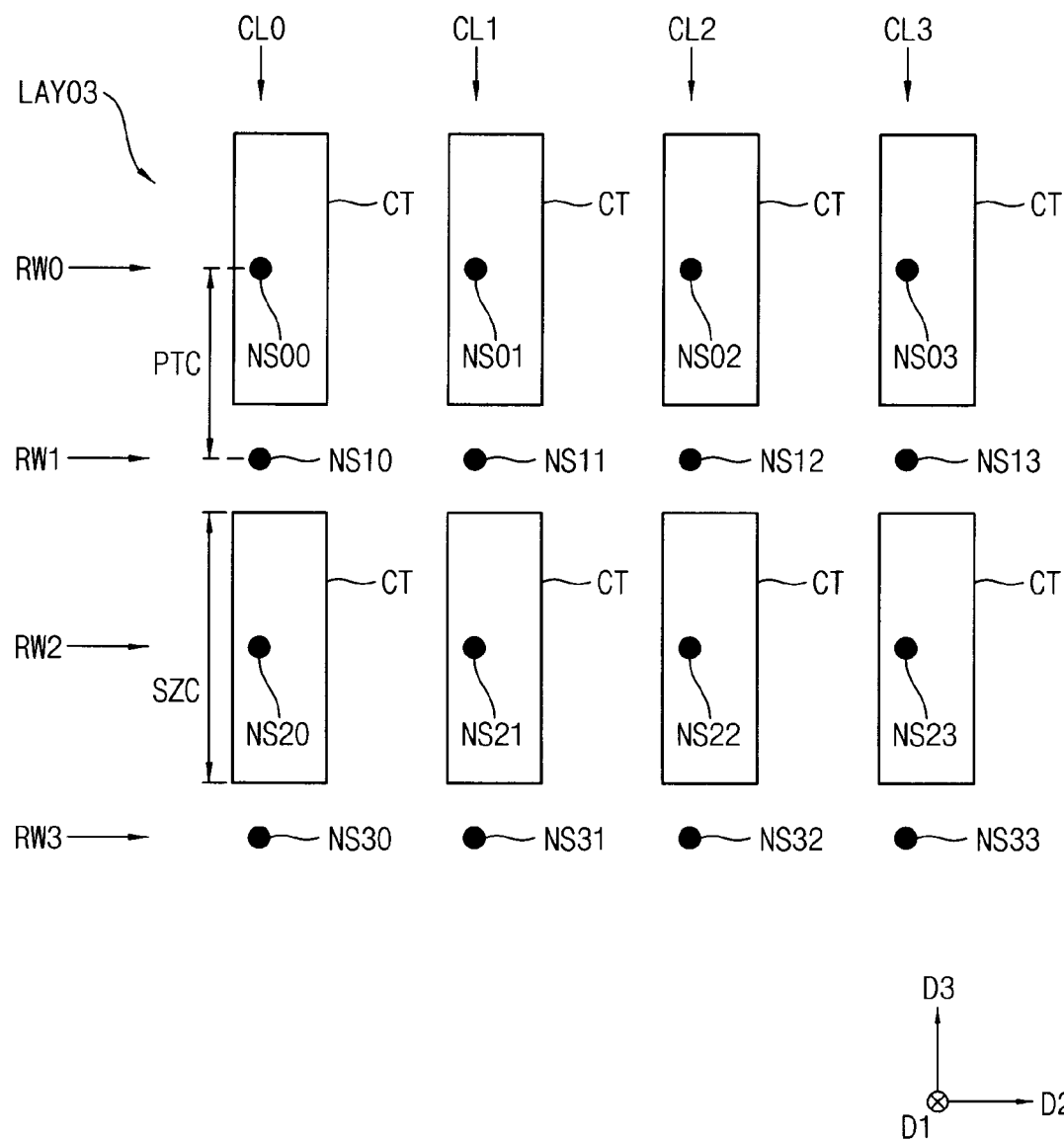
FIG. 27 illustrates a layout of a nonvolatile memory device according to embodiments of the inventive concepts.
Figure 28:
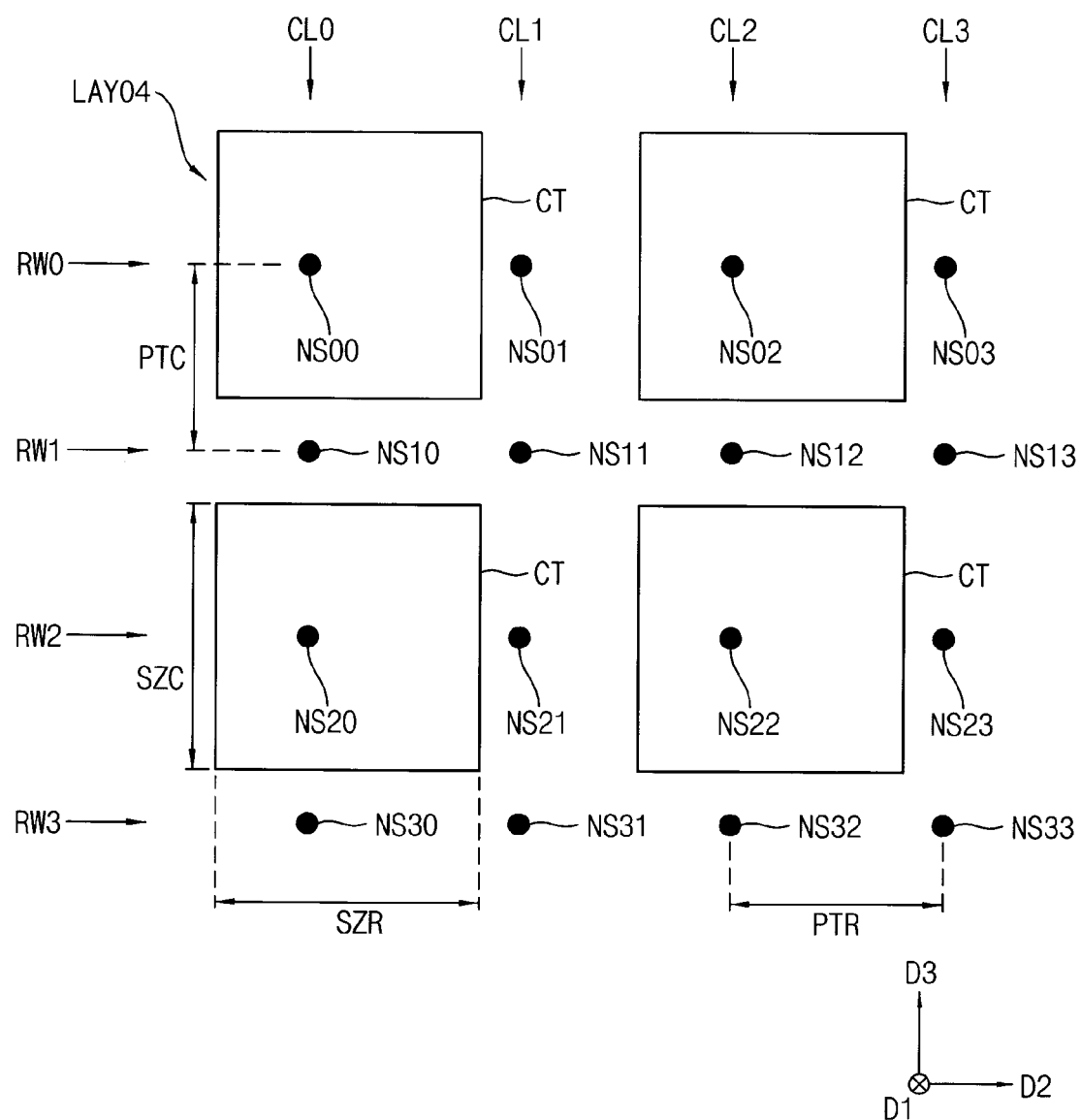
FIG. 28 illustrates a layout of a nonvolatile memory device according to embodiments of the inventive concepts.

The numbers of the rows and the columns of the switching transistors CT may be the same as those of the NAND strings NS00~NS33 as illustrated in FIG. 25. In other embodiments, the numbers of rows and columns of the switching transistors CT may be different from those of the NAND strings NS00~NS33 as illustrated in FIGS. 26, 27 and 28. In other words, FIG. 25 illustrates the layout LAYO1 such that, with respect to all of the plurality of NAND strings NS00~NS33, one switching transistor is connected to one NAND string. That is, the switching transistors CT are connected to respective different single ones of the NAND strings. In contrast, FIGS. 26, 27 and 28 illustrate the layouts LAYO2, LAYO3 and LAYO4 such that, with respect to a portion of the plurality of NAND strings NS00~NS33, one switching transistor is connected to one NAND string, and the rest of the NAND strings other than the portion of the plurality of NAND strings NS00~NS33 are not connected to a switching transistor. That is, for example a first group of the NAND strings are connected to respective different single ones of the switching transistors CT, and a second group of the NAND strings are not connected to switching transistors CT.

As illustrated in FIG. 25, when a design margin for the switching transistors CT is sufficient, the switching transistors CT may be assigned (i.e., connected) to all of the NAND strings NS00~NS33 one by one (i.e., in one-to-one correspondence).

As illustrated in FIG. 26, when a size SZR of the switching transistors CT in the row direction D2 is greater than a pitch PTR in the row direction D2 between the plurality of NAND strings NS00~NS33, the switching transistors CT may for example be assigned to the NAND strings of columns CL0 and CL2, and the switching transistors CT are not connected to the NAND strings of the other columns CL1 and CL3.

As illustrated in FIG. 27, when a size SZC of the switching transistors CT in the column direction D3 is greater than a pitch PTC in the column direction D3 between the plurality of NAND strings NS00~NS33, the switching transistors CT may for example be assigned to the NAND strings of rows RW0 and RW2, and the switching transistors CT are not connected to the NAND strings of the other rows RW1 and RW3.

If the design margin is not sufficient with respect to both of the row direction D2 and the column direction D3, the layout LAYO4 as illustrated in FIG. 28 may be adopted.

The NAND strings connected to the switching transistors CT may perform the above-described sensing multiplication operation for the processing in memory (PIM) method according to example embodiments. In contrast, the NAND strings disconnected from the switching transistors CT may be connected to the common source line to perform the normal read operations of the nonvolatile memory device. The integration degree of the nonvolatile memory device may be used fully by properly adopting the layouts LAYO1~LAYO4.

Figure 29:
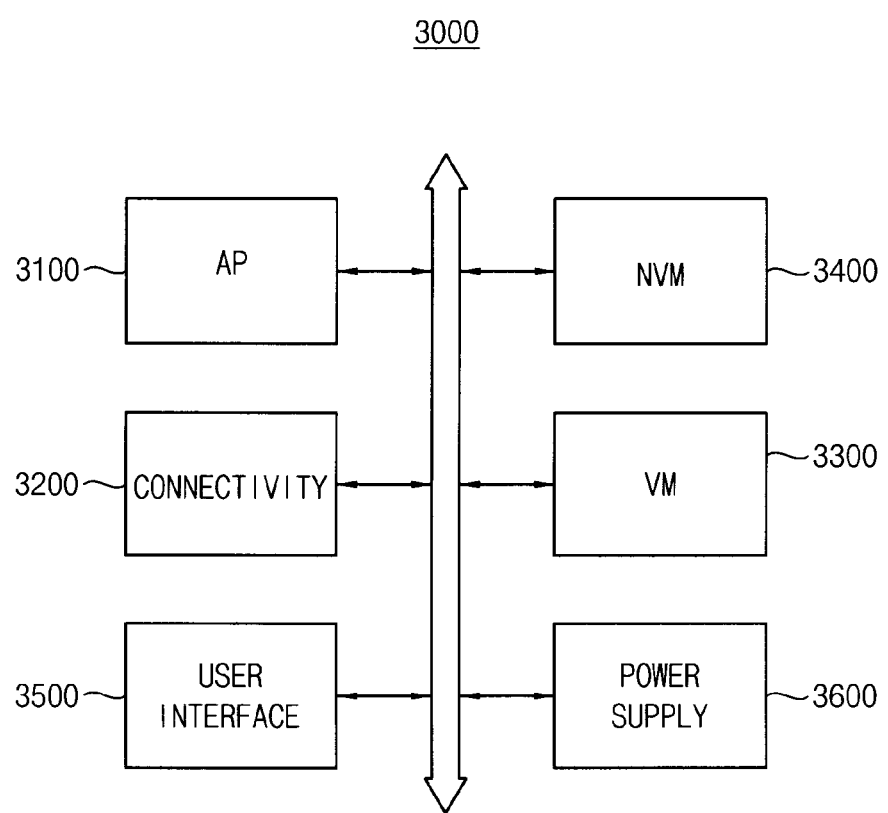
FIG. 29 illustrates a block diagram of a mobile system including a memory device according to embodiments of the inventive concepts.

FIG. 29 illustrates a block diagram of a mobile system including a memory device according to embodiments of the inventive concepts.

Referring to FIG. 29, a mobile system 3000 includes an application processor (AP) 3100, a connectivity unit 3200, a volatile memory device (VM) 3300, a nonvolatile memory device (NVM) 3400, a user interface 3500, and a power supply 3600 connected via a bus.

The application processor 3100 may execute applications such as for example a web browser, a game application, a video player, or the like. The connectivity unit 3200 may perform wired or wireless communication with an external device. The volatile memory device 3300 may store data processed by the application processor 3100, or may operate as a working memory.

The nonvolatile memory device 3400 may have a configuration to perform the sensing multiplication operation and the analog addition operation as previously described. The user interface 3500 may include at least one input device such as for example a keypad, a touch screen, or the like, and at least one output device such as for example a speaker, a display device, or the like. The power supply 3600 may supply a power supply voltage to the mobile system 3000.

As described above, the nonvolatile memory device and the processing in memory (PIM) method using the nonvolatile memory device according to example embodiments of the inventive concepts may reduce processing time and power consumption by performing data-intensive processing such as for example MLP (multilayer perceptron), RNN (recurrent neural network), CNN (convolutional neural network), and the like by performing parallel bitwise multiplications through sensing multiplication operations of the NAND strings and performing analog addition operation using the operation cell array.

The inventive concepts may be applied to nonvolatile memory devices and systems including the nonvolatile memory devices. For example, the example embodiments may be applied to systems such as for example memory cards, solid state drives (SSDs), embedded multimedia cards (eMMCs), mobile phones, smart phone, a personal digital assistant (PDA), a portable multimedia player (PMP), a digital cameras, camcorders, personal computers (PCs), server computers, workstations, laptop computers, digital TVs, set-top boxes, portable game consoles, navigation systems, wearable devices, internet of things (IoT) devices, internet of everything (IoE) devices, e-books, virtual reality (VR) devices, augmented reality (AR) devices, or the like.

The foregoing is illustrative of example embodiments of the inventive concepts and should not to be construed as limiting thereof. Although a few example embodiments have been described, those skilled in the art should readily appreciate that many modifications are possible in the example embodiments without materially departing from the inventive concepts.

What is claimed is:

1. A memory system comprising:
a nonvolatile memory device; and
a memory controller configured to control the nonvolatile memory device; and
wherein the nonvolatile memory device comprises:
a memory cell array including a plurality of NAND strings storing multiplicand data, first ends of the plurality of NAND strings connected to a plurality of bitlines, second ends of the plurality of NAND strings outputting a plurality of multiplication bits corresponding to bitwise multiplication of the multiplicand data stored in the plurality of NAND strings and multiplier data loaded on the plurality of bitlines;
an operation cell array including a plurality of switching transistors, gate electrodes of the plurality of switching transistors connected to the second ends of the plurality of NAND strings, the plurality of switching transistors selectively summing a plurality of input currents based on the plurality of multiplication bits to output a plurality of output currents; and
wherein the memory controller is further configured to transmit the multiplier data to the nonvolatile memory device.

2. The memory system of claim 1, wherein the operation cell array further comprises:
a plurality of input lines extending in a column direction and arranged in a row direction, the plurality of input lines receiving the plurality of input currents; and
a plurality of output lines extending in the row direction and arranged in the column direction, the plurality of output lines outputting the plurality of output currents, and
wherein the plurality of switching transistors are arranged in a plurality of rows and a plurality of columns, and each of the plurality of switching transistors are connected between an input line of the plurality of input lines and an output line of the plurality of output lines.

3. The memory system of claim 2, wherein first electrodes of the switching transistors arranged in a same column of the plurality of columns are connected to a same input line of the plurality of input lines, and second electrodes of the switching transistors arranged in a same row of the plurality of rows are connected to a same output line of the plurality of output lines.

4. The memory system of claim 1, wherein, with respect to all of the plurality of NAND strings, the switching transistors are connected to respective different single ones of the NAND strings.

5. The memory system of claim 1, wherein the plurality of NAND strings include a first group of the NAND strings and a second group of the NAND strings, and the first group of the NAND strings are connected to respective different single ones of the switching transistors and the second group of the NAND strings are not connected to the switching transistors.

6. The memory system of claim 1, wherein the nonvolatile memory device has a cell over periphery (COP) structure that includes a peripheral circuit structure including the operation cell array and a memory cell structure including the plurality of NAND strings stacked on the peripheral circuit structure.

7. The memory system of claim 1, wherein the nonvolatile memory device has a bonding structure that includes a first semiconductor die in which the plurality of NAND strings are formed and a second semiconductor die in which the operation cell array is formed.

8. The memory system of claim 1, wherein input currents are input via input lines, and the output currents are output via output lines, and
the bitlines extend in a column direction and are arranged in a row direction, the input lines extend in the column direction and are arranged in the row direction, the output lines extend in the row direction and are arranged in the column direction, the NAND strings are arranged in a plurality of rows and a plurality columns, and the switching transistors are arranged in a plurality of rows and a plurality of columns.

9. The memory system of claim 8, wherein first ends of the NAND strings are connected to the bitlines, second ends of the NAND strings are connected to the gate electrodes, and each of the switching transistors are connected between an input line from among the input lines and an output line from among the output lines.

10. A memory system comprising:
a nonvolatile memory device; and
a memory controller configured to control the nonvolatile memory device; and
wherein the nonvolatile memory device comprises:
a first semiconductor die including a memory cell array;
a second semiconductor die including an operation cell array and vertically connected to first semiconductor die;
the memory cell array including a plurality of NAND strings storing multiplicand data, first ends of the plurality of NAND strings connected to a plurality of bitlines, second ends of the plurality of NAND strings outputting a plurality of multiplication bits corresponding to bitwise multiplication of the multiplicand data stored in the plurality of NAND strings and multiplier data loaded on the plurality of bitlines;

the operation cell array including a plurality of switching transistors, gate electrodes of the plurality of switching transistors connected to the second ends of the plurality of NAND strings, the plurality of switching transistors selectively summing a plurality of input currents based on the plurality of multiplication bits to output a plurality of output currents; and wherein the memory controller is further configured to transmit the multiplier data to the nonvolatile memory device.

11. The memory system of claim 10, wherein the operation cell array further comprises:
a plurality of input lines extending in a column direction and arranged in a row direction, the plurality of input lines receiving the plurality of input currents; and
a plurality of output lines extending in the row direction and arranged in the column direction, the plurality of output lines outputting the plurality of output currents, and
wherein the plurality of switching transistors are arranged in a plurality of rows and a plurality of columns, and each of the plurality of switching transistors are connected between an input line of the plurality of input lines and an output line of the plurality of output lines.

12. The memory system of claim 11, wherein first electrodes of the switching transistors arranged in a same column of the plurality of columns are connected to a same input line of the plurality of input lines, and second electrodes of the switching transistors arranged in a same row of the plurality of rows are connected to a same output line of the plurality of output lines.

13. The memory system of claim 10, wherein, with respect to all of the plurality of NAND strings, the switching transistors are connected to respective different single ones of the NAND strings.

14. The memory system of claim 10, wherein the plurality of NAND strings include a first group of the NAND strings and a second group of the NAND strings, and the first group of the NAND strings are connected to respective different single ones of the switching transistors and the second group of the NAND strings are not connected to the switching transistors.

15. The memory system of claim 10, wherein input currents are input via input lines, and the output currents are output via output lines, and
the bitlines extend in a column direction and are arranged in a row direction, the input lines extend in the column direction and are arranged in the row direction, the output lines extend in the row direction and are arranged in the column direction, the NAND strings are arranged in a plurality of rows and a plurality columns, and the switching transistors are arranged in a plurality of rows and a plurality of columns.

16. The memory system of claim 15, wherein the first ends of the plurality of NAND strings are connected to the bitlines, the second ends of the plurality of NAND strings are connected to the gate electrodes, and each of the switching transistors are connected between an input line from among the input lines and an output line from among the output lines.

17. The memory system of claim 10, wherein the first semiconductor die further includes an input/output pad.

18. The memory system of claim 10, wherein the second semiconductor die further includes an input/output pad.

19. The memory system of claim 10, wherein the second semiconductor die further includes a row decoder.

20. The memory system of claim 10, wherein the second semiconductor die further includes a page buffer circuit.

* * * * *